(12) United States Patent
Katayama et al.

(10) Patent No.: US 12,463,852 B2
(45) Date of Patent: Nov. 4, 2025

(54) SEMICONDUCTOR DEVICE AND ELECTRONIC APPARATUS

(71) Applicant: SEIKO EPSON CORPORATION, Tokyo (JP)

(72) Inventors: Takao Katayama, Matsumoto (JP); Akihiro Fukuzawa, Hino (JP); Fumihito Baisho, Kai (JP); Tsutomu Nonaka, Hino (JP)

(73) Assignee: SEIKO EPSON CORPORATION (JP)

(*) Notice: Subject to any disclaimer, the term of this patent is extended or adjusted under 35 U.S.C. 154(b) by 220 days.

(21) Appl. No.: 18/361,213

(22) Filed: Jul. 28, 2023

(65) Prior Publication Data
US 2024/0048414 A1    Feb. 8, 2024

(30) Foreign Application Priority Data

Jul. 29, 2022  (JP) .................................. 2022-121541

(51) Int. Cl.
 *H04L 25/49*  (2006.01)
 *H03F 3/20*  (2006.01)
 *H03M 3/00*  (2006.01)
 *H04R 3/00*  (2006.01)

(52) U.S. Cl.
 CPC ............ *H04L 25/4902* (2013.01); *H03F 3/20* (2013.01); *H03F 2200/03* (2013.01); *H03M 3/30* (2013.01); *H04R 3/00* (2013.01)

(58) Field of Classification Search
 CPC ...................................................... G06F 3/162
 USPC ............................................................ 700/94
 See application file for complete search history.

(56) References Cited

U.S. PATENT DOCUMENTS

| | | | |
|---|---|---|---|
| 2012/0275493 A1* | 11/2012 | Fortier | H03F 3/217 |
| | | | 375/219 |
| 2018/0254757 A1* | 9/2018 | Zhang | H03F 3/2175 |
| 2020/0036348 A1* | 1/2020 | Butler | H03F 3/185 |
| 2020/0081684 A1 | 3/2020 | Akahori | |
| 2020/0236482 A1 | 7/2020 | Akahori | |
| 2021/0029454 A1 | 1/2021 | Yamashita | |

FOREIGN PATENT DOCUMENTS

| | | |
|---|---|---|
| JP | 2020-022055 A | 2/2020 |
| JP | 2020-041953 A | 3/2020 |
| JP | 2020-120243 A | 8/2020 |
| JP | 2021-022789 A | 2/2021 |

* cited by examiner

*Primary Examiner* — Alexander Krzystan

(74) *Attorney, Agent, or Firm* — Harness, Dickey & Pierce, P.L.C.

(57) ABSTRACT

Provided is a semiconductor device including: a first modulation circuit configured to receive a first sound source signal, sigma-delta modulate a signal based on the first sound source signal, and output a first sigma-delta modulated signal; a second modulation circuit configured to pulse-width modulate a signal based on the first sigma-delta modulated signal, and output a first pulse-width modulated signal; a first modulation inspection circuit configured to inspect the first modulation circuit; and a second modulation inspection circuit configured to inspect the second modulation circuit, in which the first modulation inspection circuit and the second modulation inspection circuit are separated from each other.

9 Claims, 14 Drawing Sheets

SEMICONDUCTOR DEVICE AND ELECTRONIC APPARATUS

The present application is based on, and claims priority from JP Application Serial Number 2022-121541, filed Jul. 29, 2022, the disclosure of which is hereby incorporated by reference herein in its entirety.

BACKGROUND

1. Technical Field

The present disclosure relates to a semiconductor device and an electronic apparatus.

2. Related Art

JP-A-2020-22055 discloses a sound output device. The sound output device includes: a serial audio interface that acquires digital sound information; a digital-to-analog converter that converts the digital sound information into analog sound information; an amplifier circuit; and a failure diagnosis unit, in which in the failure diagnosis unit, analog sound information output from the amplifier circuit is converted into diagnostic digital sound information, the diagnostic digital sound information and the digital sound information are compared with each other to calculate a difference value, and when the difference value exceeds a preset threshold, a failure signal in a failure state is output.

In the sound output device disclosed in JP-A-2020-22055, since an A/D converter for converting the analog sound information into the diagnostic digital sound information is required in the failure diagnosis unit, a circuit size is increased.

SUMMARY

A semiconductor device according to an aspect of the present disclosure includes:
- a first modulation circuit configured to receive a first sound source signal, sigma-delta modulate a signal based on the first sound source signal, and output a first sigma-delta modulated signal;
- a second modulation circuit configured to pulse-width modulate a signal based on the first sigma-delta modulated signal, and output a first pulse-width modulated signal;
- a first modulation inspection circuit configured to inspect the first modulation circuit; and
- a second modulation inspection circuit configured to inspect the second modulation circuit, in which
- the first modulation inspection circuit and the second modulation inspection circuit are separated from each other.

An electronic apparatus according to an aspect of the present disclosure includes:
- the semiconductor device according to the aspect; and
- a sound reproduction device, in which
- the semiconductor device includes an amplifier circuit configured to output an amplified signal obtained by amplifying the first pulse-width modulated signal to the sound reproduction device.

DESCRIPTION OF EMBODIMENTS

Hereinafter, preferred embodiments of the present disclosure will be described in detail with reference to the drawings. The embodiments described below do not unduly limit content of the present disclosure disclosed in the claims. Further, not all configurations described below are essential constituent elements of the present disclosure.

1. Semiconductor Device

1-1. First Embodiment

Figure 1:
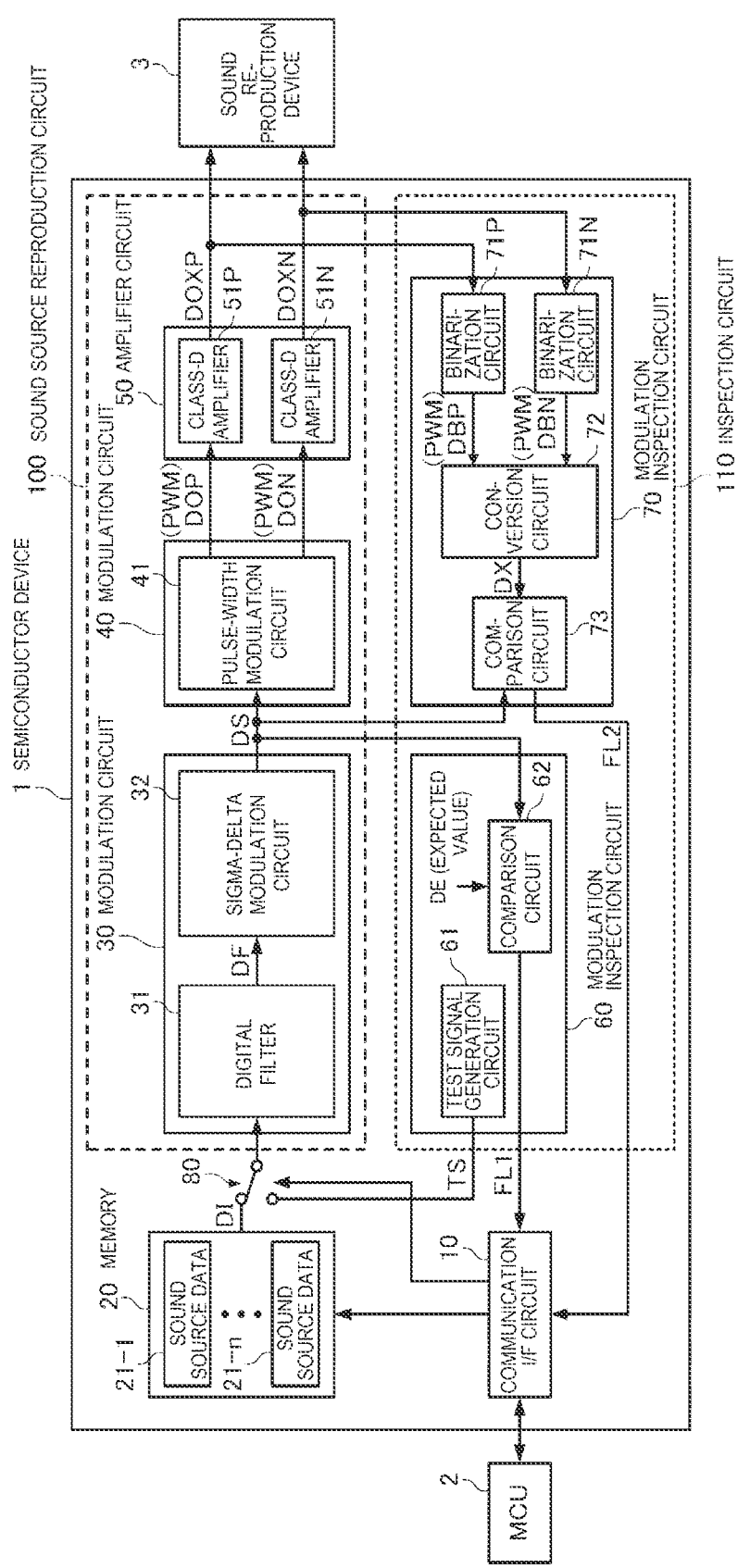
FIG. 1 is a diagram showing a configuration example of a semiconductor device according to a first embodiment.

FIG. 1 is a diagram showing a configuration example of the semiconductor device according to the first embodiment. As shown in FIG. 1, a semiconductor device 1 according to the first embodiment includes a communication interface circuit 10, a memory 20, a switch 80, a sound source reproduction circuit 100, and an inspection circuit 110. The semiconductor device 1 may be a single-chip semiconductor integrated circuit device, may be implemented by a multi-chip semiconductor integrated circuit device, or at least a part thereof may be implemented by an electronic component other than the semiconductor integrated circuit device.

In the memory 20, n pieces of sound source data 21-1 to 21-$n$ are stored. The n is an integer of one or more. The memory 20 may be, for example, a flash memory. Each piece of the sound source data 21-1 to 21-$n$ may be, for example, pulse-code modulated sound data, or may be adaptive differential pulse-code modulated sound data. The sound source data 21-1 to 21-n may be, for example, data based on various sounds such as a sound imitating a voice when a person speaks, a mechanical warning sound, and a sound effect.

The communication interface circuit 10 is a circuit that performs data communication with a micro control unit 2. The communication interface circuit 10 may be, for example, an SPI interface circuit, or may be an I2C interface circuit. The SPI is an abbreviation for a serial peripheral interface, and the I2C is an abbreviation for an inter-integrated circuit.

The communication interface circuit 10 receives various commands transmitted from the micro control unit 2, and generates various control signals corresponding to the received commands. For example, when receiving a sound source reproduction command for sound source data 21-i that is any one of the sound source data 21-1 to 21-n stored in the memory 20, the communication interface circuit 10 reads the sound source data 21-i from the memory 20, inputs the sound source data 21-i to the sound source reproduction circuit 100 as a sound source signal DI, and instructs the sound source reproduction circuit 100 to reproduce the sound source data 21-i. Further, for example, when receiving a sound source stop command for the sound source data 21-i in reproduction, the communication interface circuit 10 instructs the sound source reproduction circuit 100 to stop the reproduction. Further, for example, when receiving various setting commands related to the sound source reproduction, the communication interface circuit 10 performs various settings on the sound source reproduction circuit 100. Further, for example, when receiving a setting command of an operation mode of the semiconductor device 1, the communication interface circuit 10 sets the semiconductor device 1 in an operation mode designated by the command. The semiconductor device 1 includes a plurality of operation modes including a normal operation mode and an inspection mode.

In response to a control signal output from the communication interface circuit 10, the switch 80 outputs either one of the sound source signal DI and a test signal TS to the sound source reproduction circuit 100. Specifically, the sound source signal DI is input to the sound source reproduction circuit 100 in the normal operation mode, and the test signal TS is input to the sound source reproduction circuit 100 in the inspection mode.

In the embodiment, the sound source signal DI input to the sound source reproduction circuit 100 is a pulse-code modulated signal. When the sound source data 21-1 to 21-n is compressed sound data or the adaptive differential pulse-code modulated sound data, the sound source data 21-i that is a reproduction target is converted into the sound source signal DI that is the pulse-code modulated signal by a decoder (not shown).

The sound source reproduction circuit 100 converts the sound source signal DI into amplified signals DOXP and DOXN that are sound signals, and outputs the amplified signals DOXP and DOXN to a sound reproduction device 3 coupled to the semiconductor device 1. Accordingly, sounds corresponding to the amplified signals DOXP and DOXN are output from the sound reproduction device 3. For example, the sound reproduction device 3 may be a speaker or a buzzer. The sound output from the sound reproduction device 3 may be, for example, a sound imitating a voice when a person speaks, or may be various sounds such as a mechanical warning sound or a sound effect.

As shown in FIG. 1, in the embodiment, the sound source reproduction circuit 100 includes a modulation circuit 30, a modulation circuit 40, and an amplifier circuit 50.

The modulation circuit 30 receives the sound source signal DI, sigma-delta modulates a signal based on the sound source signal DI, and outputs a sigma-delta modulated signal DS. The signal based on the sound source signal DI may be the sound source signal DI itself, or a signal obtained by performing some processing on the sound source signal DI. In the embodiment, the modulation circuit 30 includes a digital filter 31 and a sigma-delta modulation circuit 32.

The digital filter 31 is a low-pass filter that receives the sound source signal DI and outputs a signal DF obtained by reducing a high-frequency noise included in the sound source signal DI. The sigma-delta modulation circuit 32 receives the signal DF from the digital filter 31, and performs the sigma-delta modulation by oversampling the signal DF at an n-fold sampling ratio, thereby outputting the sigma-delta modulated signal DS in which a noise is biased in a high-frequency band. The n is an integer of two or more. Therefore, when a sampling frequency of the sound source signal DI is fs, a sampling frequency of the signal DF output from the digital filter 31 is fs, and a sampling frequency of the sigma-delta modulated signal DS is n×fs. The digital filter 31 functions as an antialiasing filter for reducing a high-frequency noise folded back into a signal band due to oversampling of the sigma-delta modulation circuit 32.

In this way, the modulation circuit 30 sigma-delta modulates a signal obtained by performing digital filter processing on the sound source signal DI to output the sigma-delta modulated signal DS.

The modulation circuit 40 receives the sigma-delta modulated signal DS, and pulse-width modulates a signal based on the sigma-delta modulated signal DS to output pulse-width modulated signals DOP and DON. The signal based on the sigma-delta modulated signal DS may be the sigma-delta modulated signal DS itself, or may be a signal obtained by performing some processing on the sigma-delta modulated signal DS. In the embodiment, the modulation circuit 40 includes a pulse-width modulation circuit 41.

The pulse-width modulation circuit 41 pulse-width modulates the sigma-delta modulated signal DS that is the signal based on the sound source signal DI to output pulse-width modulated signals DOP and DON. Each of the pulse-width modulated signals DOP and DON is a 1-bit digital signal. When the sampling frequency of the sigma-delta modulated signal DS is n×fs, sampling frequencies of the pulse-width modulated signals DOP and DON are n×m×fs. Here, when the number of bits of the sigma-delta modulated signal DS is M, $m=2^M$.

Figure 2:
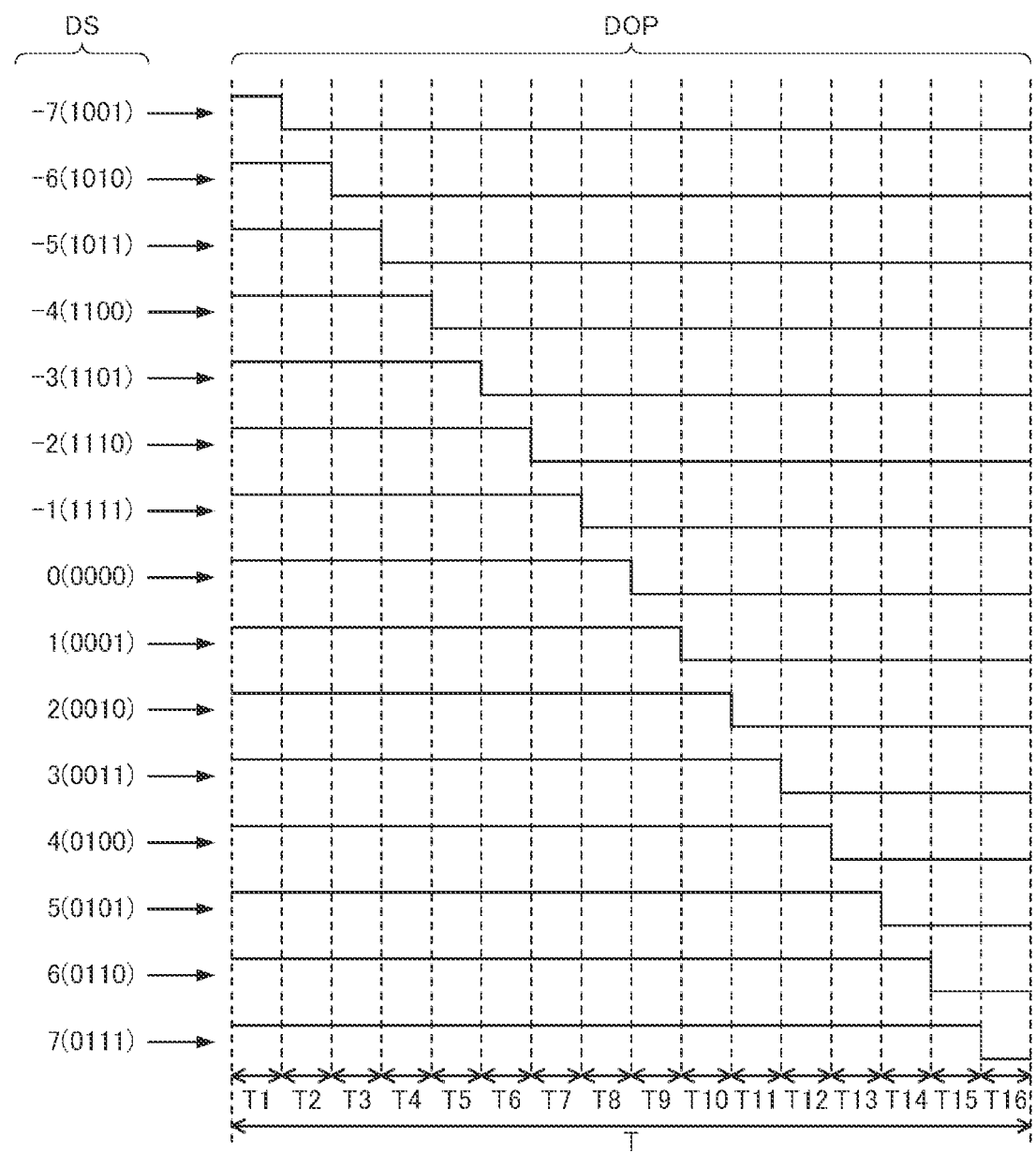
FIG. 2 is a diagram showing an example of pulse-width modulation for generating a pulse-width modulated signal DOP.
Figure 3:
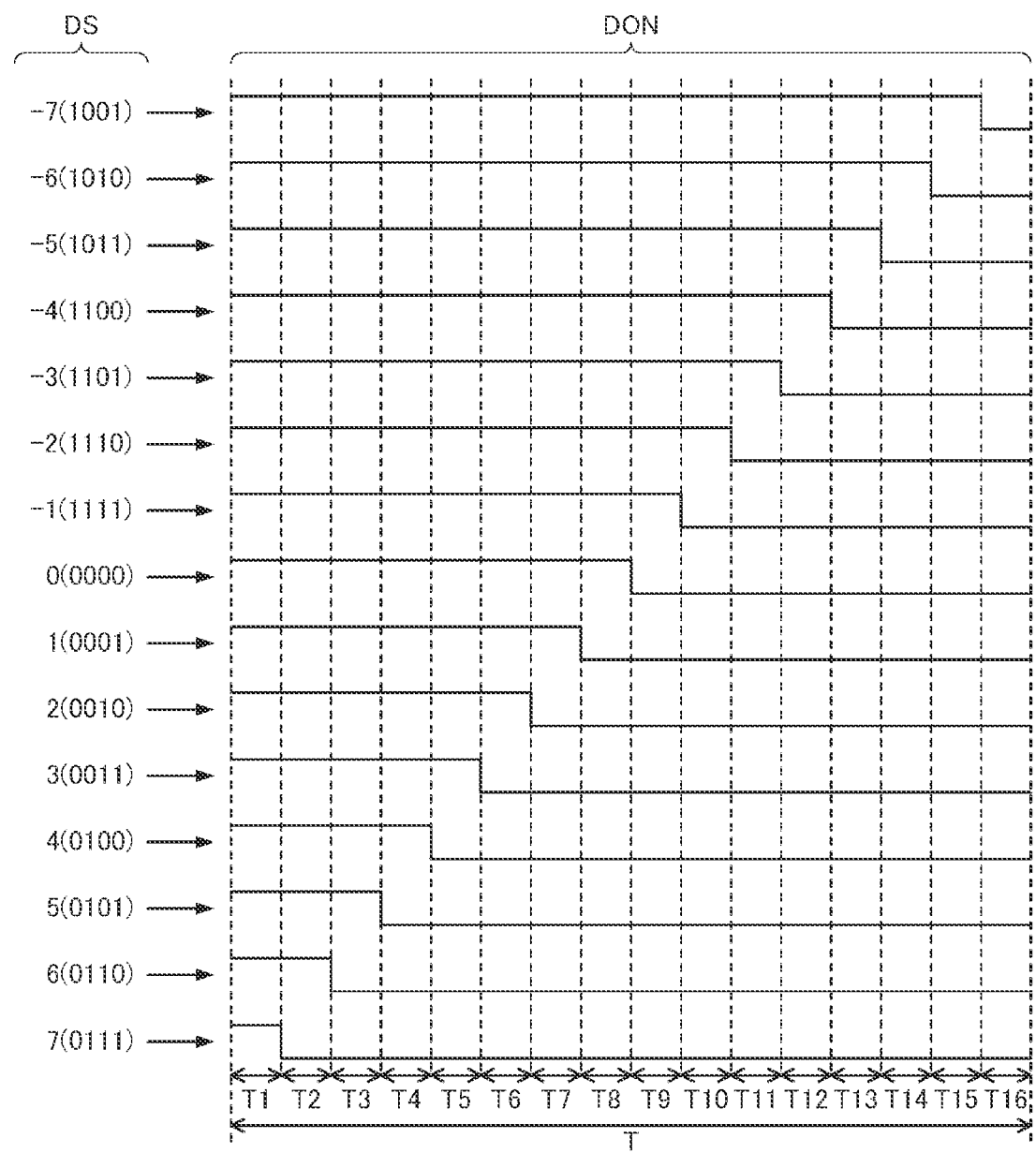
FIG. 3 is a diagram showing an example of pulse-width modulation for generating a pulse-width modulated signal DON.

The pulse-width modulation for generating the pulse-width modulated signal DOP and the pulse-width modulation for generating the pulse-width modulated signal DON are different in methods. FIG. 2 is a diagram showing an example of the pulse-width modulation for generating the pulse-width modulated signal DOP. Further, FIG. 3 is a diagram showing an example of the pulse-width modulation for generating the pulse-width modulated signal DON. FIGS. 2 and 3 show examples when the number of bits M of the sigma-delta modulated signal DS is 4. In FIGS. 2 and 3, the sigma-delta modulated signal DS is updated with a period T as a cycle, and the pulse-width modulated signals DOP and DON are at a high level or a low level in 16 sections T1 to T16 obtained by dividing the period T. That is, a length of the period T is 1/(n×fs), and a length of each of the sections T1 to T16 is 1/(n×m×fs).

As shown in FIG. 2, the larger the value of the sigma-delta modulated signal DS, the longer the pulse-width modulated signal DOP is at the high level. For example, when the sigma-delta modulated signal DS is decimal "−7", that is, binary "1001", the pulse-width modulated signal DOP is at the high level in the section T1, and is at the low level in the 15 sections T2 to T16. Further, for example, when the sigma-delta modulated signal DS is decimal "0", that is, binary "0000", the pulse-width modulated signal DOP is at the high level in the 8 sections T1 to T8, and is at the low level in the 8 sections T9 to T16. Further, for example, when the sigma-delta modulated signal DS is decimal "7", that is, binary "0111", the pulse-width modulated signal DOP is at the high level in the 15 sections T1 to T15, and is at the low level in the section T16.

As shown in FIG. 3, the larger the value of the sigma-delta modulated signal DS, the shorter the pulse-width modulated signal DON is at the high level. For example, when the sigma-delta modulated signal DS is decimal "−7", that is, binary "1001", the pulse-width modulated signal DON is at the high level in the 15 sections T1 to T15, and is at the low level in the section T16. Further, for example, when the sigma-delta modulated signal DS is decimal "0", that is, binary "0000", the pulse-width modulated signal DON is at the high level in the 8 sections T1 to T8, and is at the low level in the 8 sections T9 to T16. Further, for example, when the sigma-delta modulated signal DS is decimal "7", that is, binary "0111", the pulse-width modulated signal DON is at the high level in the section T1, and is at the low level in the 15 sections T2 to T16.

Figure 4:
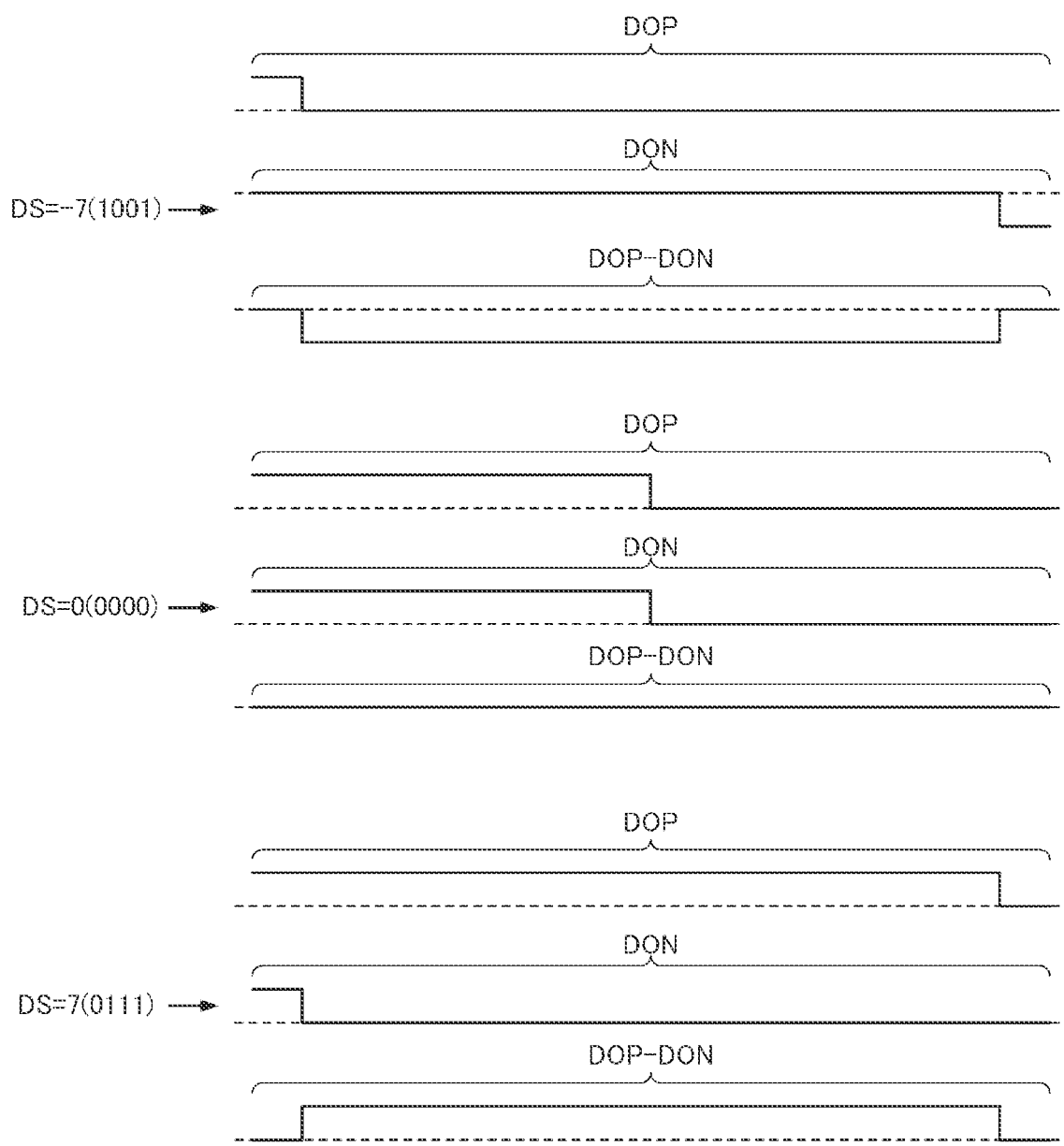
FIG. 4 is a diagram showing an example of a difference between the pulse-width modulated signal DOP and the pulse-width modulated signal DON.

Therefore, for example, a difference between the pulse-width modulated signal DOP and the pulse-width modulated signal DON when the sigma-delta modulated signal DS is the decimal "−7", "0", or "7" is as shown in FIG. 4.

Returning to the description of FIG. 1, the amplifier circuit 50 receives the pulse-width modulated signals DOP and DON, and outputs the amplified signals DOXP and DOXN obtained by amplifying the pulse-width modulated signals DOP and DON to the sound reproduction device 3. In the embodiment, the amplifier circuit 50 includes two class-D amplifiers 51P and 51N. The class-D amplifier 51P outputs the amplified signal DOXP obtained by class-D amplifying the pulse-width modulated signal DOP. The class-D amplifier 51N outputs the amplified signal DOXN obtained by class-D amplifying the pulse-width modulated signal DON. The sound reproduction device 3 reproduces a sound having a magnitude corresponding to a voltage difference between the amplified signal DOXP and the amplified signal DOXN.

The amplifier circuit 50 outputs the amplified signals DOXP and DOXN to the sound reproduction device 3 in the normal operation mode, and stops outputting the amplified signals DOXP and DOXN such that the sound reproduction device 3 does not generate the sound in the inspection mode.

The inspection circuit 110 is a circuit that inspects the sound source reproduction circuit 100. As shown in FIG. 1, in the embodiment, the inspection circuit 110 includes a modulation inspection circuit 60 and a modulation inspection circuit 70.

The modulation inspection circuit 60 inspects the modulation circuit 30 in the inspection mode. In the embodiment, the modulation inspection circuit 60 includes a test signal generation circuit 61 and a comparison circuit 62.

The test signal generation circuit 61 generates at least one of an impulse signal and a step signal as a test signal TS, and inputs the test signal TS to the digital filter 31 of the modulation circuit 30 via the switch 80. Therefore, the modulation circuit 30 outputs the sigma-delta modulated signal DS obtained by sigma-delta modulating the test signal TS by the digital filter 31 and the sigma-delta modulation circuit 32 in the inspection mode.

Figure 5:
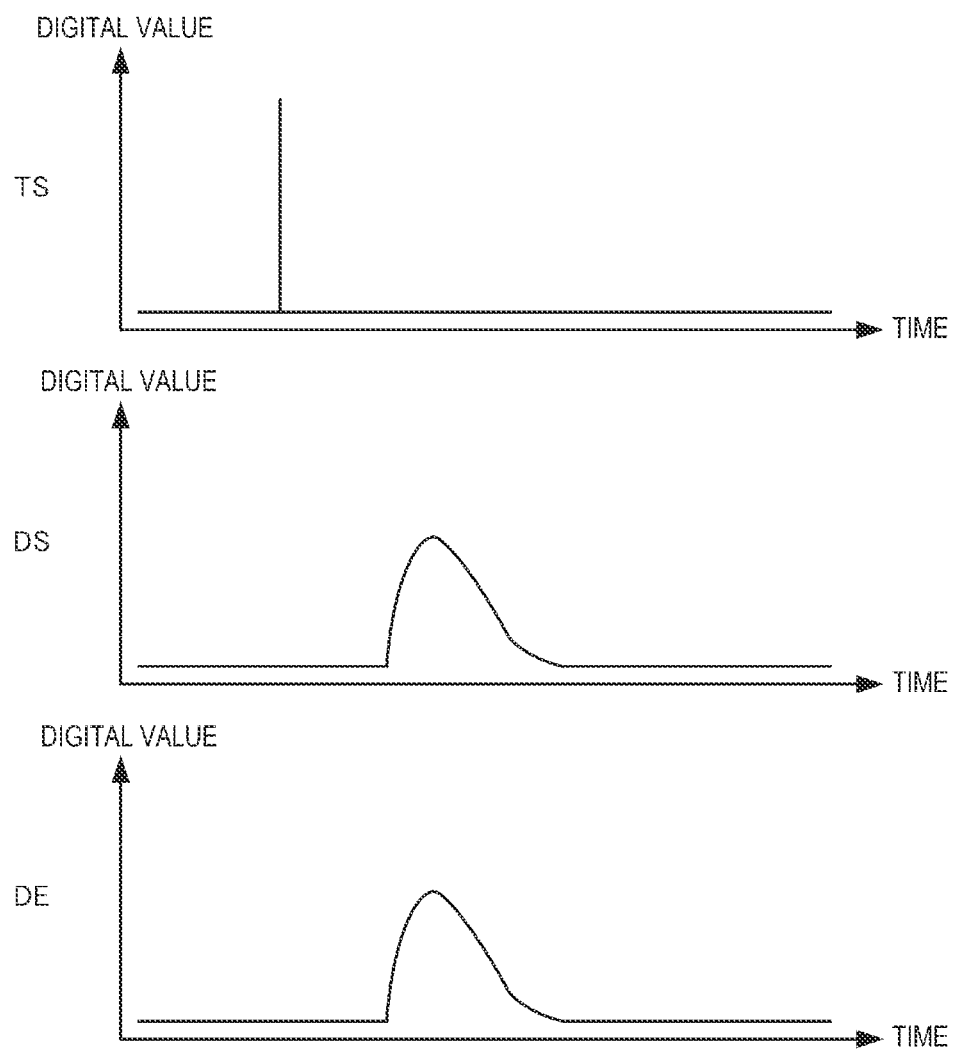
FIG. 5 is a diagram showing an example of a test signal, a sigma-delta modulated signal, and an expected value signal.
Figure 6:
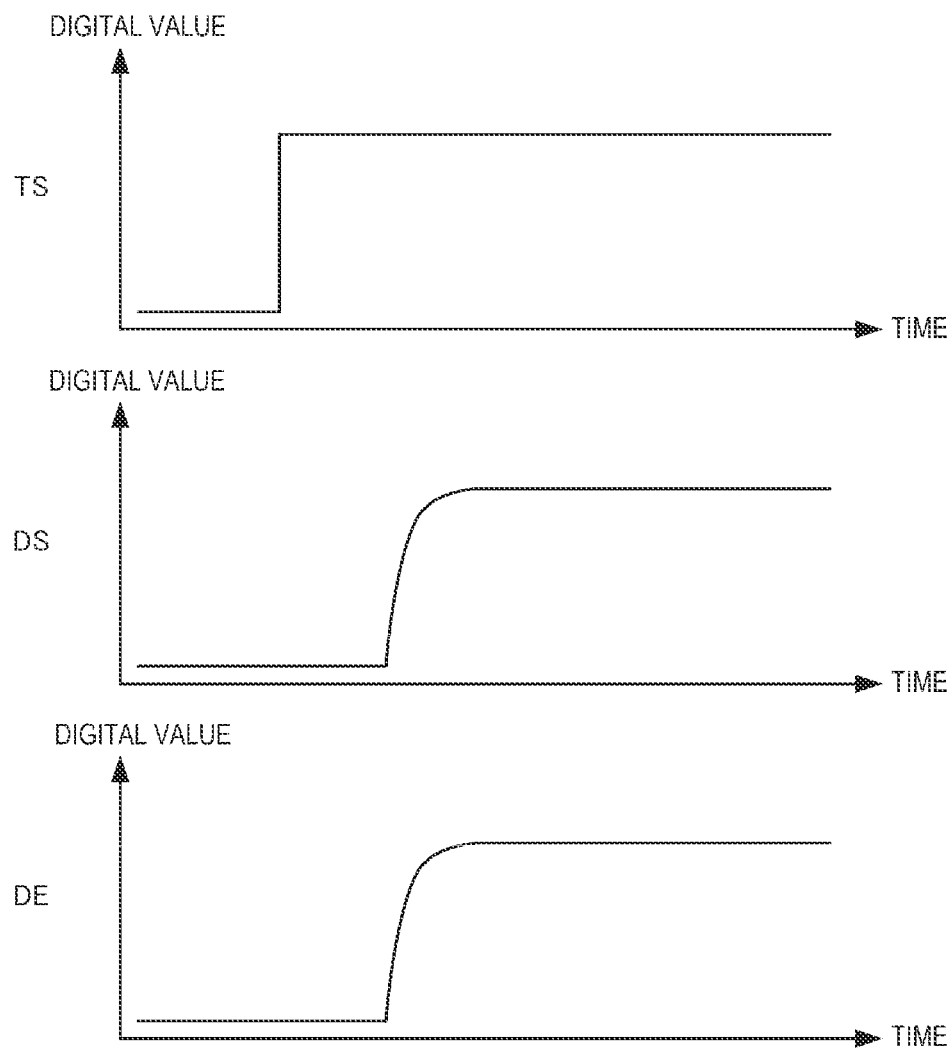
FIG. 6 is a diagram showing another example of the test signal, the sigma-delta modulated signal, and the expected value signal.

The comparison circuit 62 compares the sigma-delta modulated signal DS with an expected value signal DE. Since the processing of the modulation circuit 30 is entirely digital processing, a digital value and delay time of the sigma-delta modulated signal DS generated for the test signal TS do not vary. Therefore, as shown in FIGS. 5 and 6, if the modulation circuit 30 is normal, the sigma-delta modulated signal DS accurately coincides with the expected value signal DE generated in advance by simulation or the like. FIG. 5 shows an example when the test signal TS is the impulse signal, and FIG. 6 shows an example when the test signal TS is the step signal. The comparison circuit 62 compares the sigma-delta modulated signal DS with the expected value signal DE, and generates a flag signal FL1 indicating whether both the sigma-delta modulated signal DS and the expected value signal DE coincide with each other.

In this way, the modulation inspection circuit 60 inputs at least one of the impulse signal and the step signal instead of the sound source signal DI to the modulation circuit 30, and inspects the modulation circuit 30 based on the signal output from the modulation circuit 30 in the inspection mode.

When receiving a command for reading the flag signal FL1 from the micro control unit 2, the communication interface circuit 10 acquires the flag signal FL1 from the modulation inspection circuit 60 and transmits the flag signal FL1 to the micro control unit 2. For example, the micro control unit 2 can determine presence or absence of a failure in the modulation circuit 30 based on the flag signal FL1.

As described above, in the inspection mode, the amplifier circuit 50 stops outputting the amplified signals DOXP and DOXN such that the sound reproduction device 3 does not generate an abnormal sound corresponding to the test signal TS.

The modulation inspection circuit 70 inspects the modulation circuit 40 in the inspection mode. Further, the modulation inspection circuit 70 also inspects the amplifier circuit 50 in the inspection mode. In the embodiment, the modulation inspection circuit 70 includes two binarization circuits 71P and 71N, a conversion circuit 72, and a comparison circuit 73.

The binarization circuit 71P generates a pulse-width modulated signal DBP by binarizing the amplified signal DOXP. The binarization circuit 71N generates a pulse-width modulated signal DBN by binarizing the amplified signal DOXN.

Figure 7:
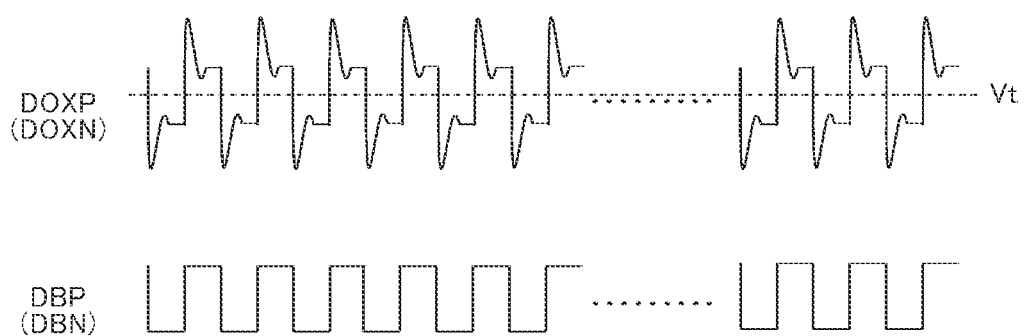
FIG. 7 is a diagram illustrating an operation of a binarization circuit.

As shown in FIG. 7, in the amplified signals DOXP and DOXN, an overshoot occurs at a rising edge, and an undershoot occurs at a falling edge. The binarization circuit 71P is, for example, a comparator that compares a voltage of the amplified signal DOXP with a threshold voltage Vt, and outputs the pulse-width modulated signal DBP that is at a high level when the voltage of the amplified signal DOXP is higher than the threshold voltage Vt, and that is at a low level when the voltage of the amplified signal DOXP is lower than the threshold voltage Vt. Similarly, the binarization circuit 71N is, for example, a comparator that compares a voltage of the amplified signal DOXN with the threshold voltage Vt, and outputs the pulse-width modulated signal DBN that is at a high level when the voltage of the amplified signal DOXN is higher than the threshold voltage Vt, and that is at a low level when the voltage of the amplified signal DOXN is lower than the threshold voltage Vt. By the binarization circuits 71P and 71N, the overshoots or the undershoots of the amplified signals DOXP and DOXN are removed, and the pulse-width modulated signals DBP and DBN in each of which the high level is shifted to a power supply voltage of a logic circuit are obtained.

Returning to the description of FIG. 1, the conversion circuit 72 receives the pulse-width modulated signals DBP and DBN based on the pulse-width modulated signals DOP and DON, and converts the pulse-width modulated signals DBP and DBN into a pulse-code modulated signal DX.

Figure 8:
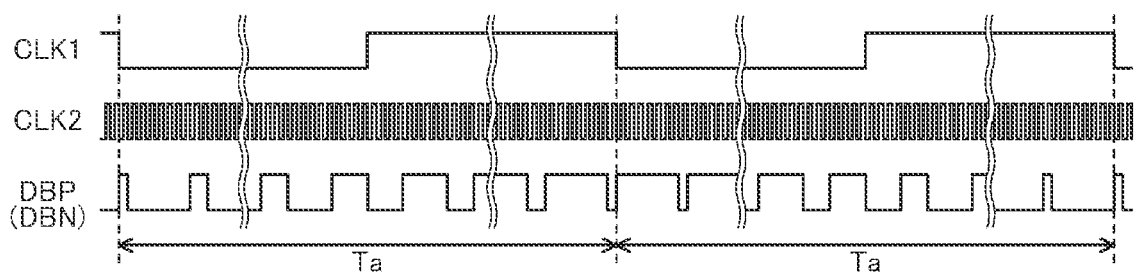
FIG. 8 is a diagram illustrating an operation of a conversion circuit.

Specifically, the conversion circuit 72 converts the pulse-width modulated signals DBP and DBN into the pulse-code modulated signal DX based on a clock signal CLK1 (not shown) having a frequency of n×fs and a clock signal CLK2 (not shown) having a frequency of n×m×fs. Specifically, as shown in FIG. 8, the conversion circuit 72 counts the high level of each of the pulse-width modulated signals DBP and DBN by the clock signal CLK2 in one cycle Ta of the clock signal CLK1. That is, the conversion circuit 72 integrates the pulse-width modulated signals DBP and DBN in the cycle Ta. The conversion circuit 72 generates the pulse-code modulated signal DX based on integrated values of the pulse-width modulated signals DBP and DBN. The conversion from the pulse-width modulated signals DBP and DBN into the pulse-code modulated signal DX corresponds to inverse conversion of the conversion from the sigma-delta modulated signal DS into the pulse-width modulated signals DOP and DON. In this way, the conversion circuit 72 integrates the pulse-width modulated signals DBP and DBN in a predetermined cycle and generates the pulse-code modulated signal DX.

The comparison circuit 73 receives the sigma-delta modulated signal DS that is the pulse-code modulated signal and the pulse-code modulated signal DX, and compares the sigma-delta modulated signal DS with the pulse-code modulated signal DX. In practice, since a predetermined time is required from when the sigma-delta modulated signal DS is input to the modulation circuit 40 to when the pulse-code modulated signal DX corresponding to the sigma-delta modulated signal DS is generated, the comparison circuit 73 delays the sigma-delta modulated signal DS by the predetermined time and compares the sigma-delta modulated signal DS with the pulse-code modulated signal DX. The comparison circuit 73 generates a flag signal FL2 indicating whether the sigma-delta modulated signal DS and the pulse-code modulated signal DX coincide with each other.

In this way, in the inspection mode, the modulation inspection circuit 70 compares the pulse-code modulated signal DX that is a signal obtained by integrating the pulse-width modulated signals DBP and DBN in the predetermined cycle with the sigma-delta modulated signal DS to inspect the modulation circuit 40. The modulation inspection circuit 70 can inspect the modulation circuit 40 even when the sound reproduction device 3 reproduces a sound corresponding to the sound source signal DI in the normal mode.

When receiving a command for reading the flag signal FL2 from the micro control unit 2, the communication interface circuit 10 acquires the flag signal FL2 from the modulation inspection circuit 70 and transmits the flag signal FL2 to the micro control unit 2. For example, the micro control unit 2 can determine presence or absence of a failure in the modulation circuit 40 based on the flag signal FL2.

As shown in FIG. 1, in the embodiment, the modulation inspection circuit 60 and the modulation inspection circuit 70 are separated from each other. That is, the modulation inspection circuit 60 is a circuit specialized in inspecting the modulation circuit 30, and does not inspect the modulation circuit 40. Similarly, the modulation inspection circuit 70 is a circuit specialized in inspecting the modulation circuit 40, and does not inspect the modulation circuit 30. Therefore, the micro control unit 2 can determine presence or absence of a failure in the modulation circuit 30 by the flag signal FL1 generated by the modulation inspection circuit 60, and can determine presence or absence of a failure in the modulation circuit 40 by the flag signal FL2 generated by the modulation inspection circuit 70.

In the first embodiment, the sound source signal DI is an example of a "first sound source signal", the sigma-delta modulated signal DS is an example of a "first sigma-delta modulated signal", and the pulse-width modulated signals DOP and DON are examples of a "first pulse-width modulated signal". Further, the modulation circuit 30 is an example of a "first modulation circuit", and the modulation circuit 40 is an example of a "second modulation circuit". Further, the modulation inspection circuit 60 is an example of a "first modulation inspection circuit", and the modulation inspection circuit 70 is an example of a "second modulation inspection circuit".

The semiconductor device 1 according to the first embodiment has a configuration that can cause one sound reproduction device 3 to output a sound, and may have a configuration that can cause a plurality of sound output devices to output sounds.

As described above, in the semiconductor device 1 according to the first embodiment, since the modulation circuit 30 modulates the sound source signal DI into the sigma-delta modulated signal DS by the digital signal processing, the modulation inspection circuit 60 can inspect the modulation circuit 30 by the digital processing. Further, the modulation circuit 40 modulates the sigma-delta modulated signal DS into the pulse-width modulated signals DOP and DON by the digital signal processing, and the amplifier circuit 50 outputs the amplified signals DOXP and DOXN that are the digital signals obtained by amplifying the pulse-width modulated signals DOP and DON. Therefore, the modulation inspection circuit 70 can inspect the modulation circuit 40 and the amplifier circuit 50 by the digital processing. Therefore, according to the semiconductor device 1 in the first embodiment, A/D converters are not required in the modulation inspection circuit 60 and the modulation inspection circuit 70, and the inspection circuit 110 having a relatively small size can inspect the sound source reproduction circuit 100 including the modulation circuit 30, the modulation circuit 40, and the amplifier circuit 50.

In the semiconductor device 1 according to the first embodiment, since the modulation inspection circuit 60 and the modulation inspection circuit 70 are separated from each other, the inspection of the modulation circuit 30 performed by the modulation inspection circuit 60 and the inspection of the modulation circuit 40 performed by the modulation inspection circuit 70 are performed independently of each other. Therefore, the micro control unit 2 can detect a failure in the modulation circuit 30 based on the flag signal FL1 output from the modulation inspection circuit 60, and can detect a failure in the modulation circuit 40 based on the flag signal FL2 output from the modulation inspection circuit 70.

In the semiconductor device 1 according to the first embodiment, the modulation inspection circuit 60 can accurately inspect the modulation circuit 30 including the digital filter 31 based on the sigma-delta modulated signal DS output from the modulation circuit 30 when at least one of the impulse signal and the step signal is input to the modulation circuit 30.

In the semiconductor device 1 according to the first embodiment, in the modulation inspection circuit 70, the binarization circuits 71P and 71N remove the overshoots or the undershoots generated in the pulse-width modulated amplified signals DOXP and DOXN, and no loss of useful information occurs during the conversion from the amplified signals DOXP and DOXN into the pulse-width modulated signals DBP and DBN. Further, in the modulation inspection circuit 70, the conversion circuit 72 can convert the pulse-width modulated signals DBP and DBN into the pulse-code modulated signal DX without losing the information by integrating the pulse-width modulated signals DBP and DBN in the predetermined cycle. Therefore, in the modulation inspection circuit 70, the comparison circuit 73 can accurately inspect the modulation circuit 40 by comparing the sigma-delta modulated signal DS with the pulse-code modulated signal DX in which no information is lost.

1-2. Second Embodiment

Hereinafter, for the semiconductor device 1 according to the second embodiment, configurations similar to those of the first embodiment are denoted by the same reference numerals, description similar to that of the first embodiment will be omitted or simplified, and content different from that of the first embodiment will be mainly described.

Figure 9:
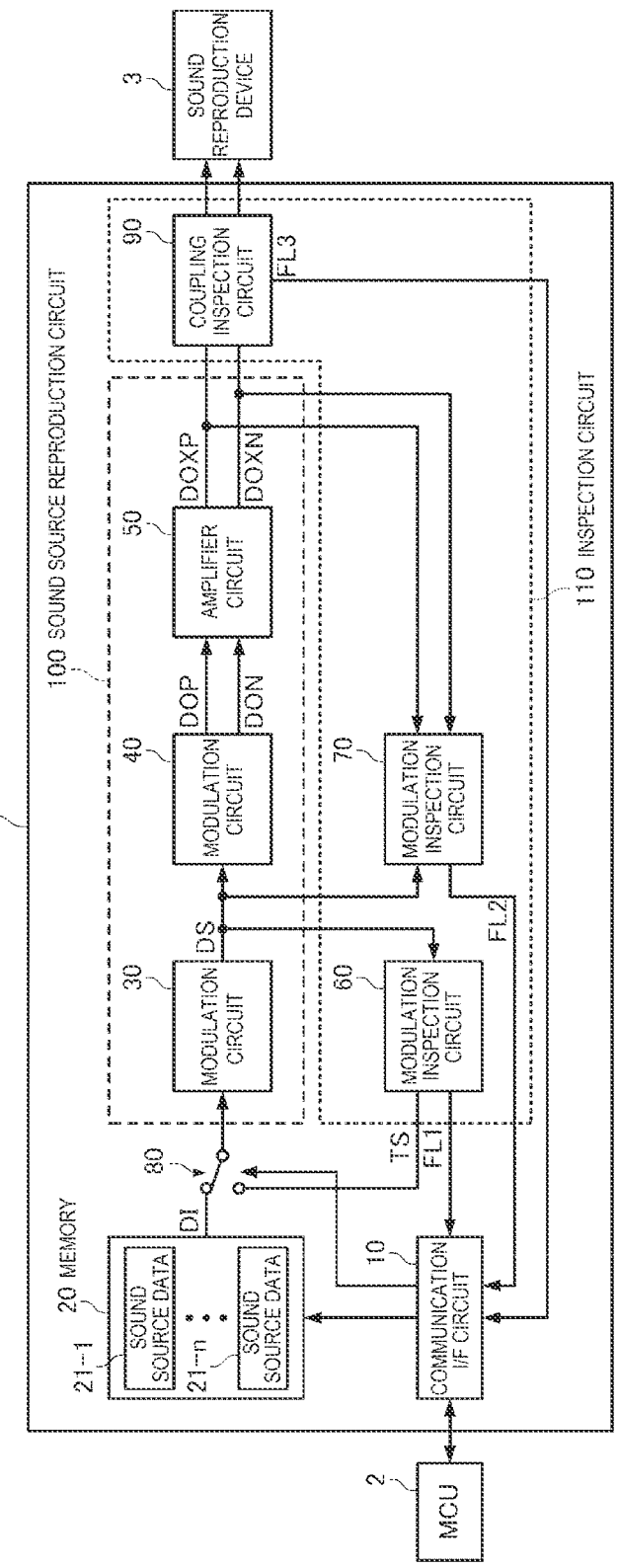
FIG. 9 is a diagram showing a configuration example of a semiconductor device according to a second embodiment.

FIG. 9 is a diagram showing a configuration example of the semiconductor device 1 according to the second embodiment. As shown in FIG. 9, the semiconductor device 1 according to the second embodiment is different from the semiconductor device 1 according to the first embodiment shown in FIG. 1 in that the inspection circuit 110 includes a coupling inspection circuit 90. The coupling inspection circuit 90 is provided between the amplifier circuit 50 and the sound reproduction device 3, and inspects coupling between the amplifier circuit 50 and the sound reproduction device 3 in the inspection mode. As described above, in the inspection mode, the amplifier circuit 50 stops outputting the amplified signals DOXP and DOXN such that the sound reproduction device 3 does not generate an abnormal sound.

Figure 10:
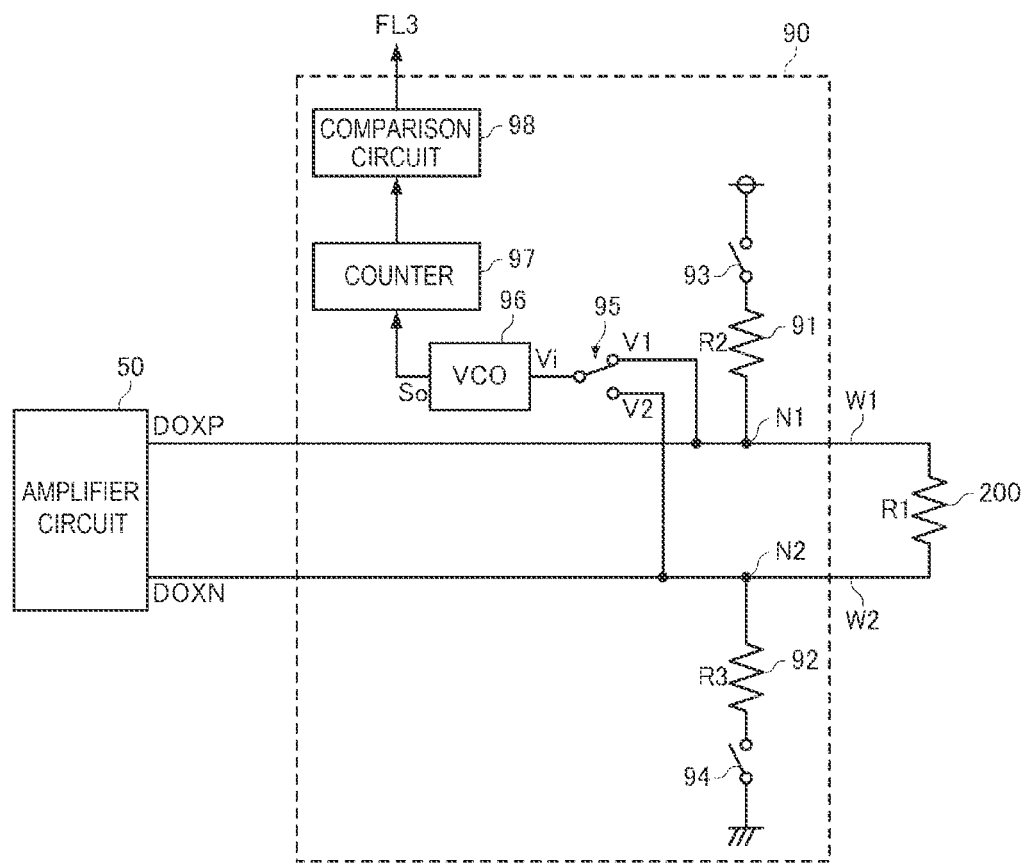
FIG. 10 is a diagram showing a configuration example of a coupling inspection circuit.

FIG. 10 is a diagram showing a configuration example of the coupling inspection circuit 90. In the example in FIG. 10, the coupling inspection circuit 90 includes two resistors 91 and 92, three switches 93, 94, and 95, a voltage-controlled oscillator 96, a counter 97, and a comparison circuit 98. In FIG. 10, a resistor 200 is an internal resistor of the sound reproduction device 3.

As shown in FIG. 10, an output terminal from which the amplifier circuit 50 outputs the amplified signal DOXP is electrically coupled to one end of the resistor 200 by a wiring W1. Further, an output terminal from which the amplifier circuit 50 outputs the amplified signal DOXN is electrically coupled to the other end of the resistor 200 by a wiring W2.

One end of the resistor 91 is coupled to one end of the switch 93, and the other end of the resistor 91 is coupled to one end of the resistor 200. A power supply voltage VDD is supplied to the other end of the switch 93. One end of the resistor 92 is coupled to the other end of the resistor 200, and the other end of the resistor 92 is coupled to one end of the switch 94. A ground voltage VSS is supplied to the other end of the switch 94. The resistors 91 and 92 are inspection resistors coupled in series to the resistor 200 that is the internal resistor of the sound reproduction device 3 between a power supply and ground.

The switches 93 and 94 are both in a nonconductive state in the normal operation mode, and are both in the conductive state in the inspection mode. Therefore, in the inspection mode, when the wirings W1 and W2 are normal, a current flows from the power supply to the ground via the resistors 91, 200, and 92. Therefore, a voltage V1 of a node N1 at which the other end of the resistor 91 and the one end of the resistor 200 are coupled to each other is expressed by Equation (1). Further, a voltage V2 of a node N2 at which the other end of the resistor 200 and the one end of the resistor 92 are coupled to each other is expressed by Equation (2).

$$V1 = \frac{R1 + R3}{R1 + R2 + R3} \times (VDD - VSS) \tag{1}$$

$$V2 = \frac{R3}{R1 + R2 + R3} \times (VDD - VSS) \tag{2}$$

On the other hand, when the wiring W1 or the wiring W2 is decoupled, V1=VDD and V2=VSS. Further, when the wiring W1 and the wiring W2 are grounded, V1=V2=VSS. Further, when the wiring W1 and the wiring W2 are short-circuited, V1=V2=(VDD−VSS)/2.

Here, a value R1 of the internal resistor 200 of the sound reproduction device 3 is about several Q. In the inspection mode, in order to limit the current that flows through the resistors 91, 200, and 92 to 1 mA or less, a value R2 of the resistor 91 and a value R3 of the resistor 92 are required to be several kΩ. For example, if R1=8Ω and R2 and R3=4 kΩ, the current that flows through the resistors 91, 200, and 92 is smaller than 1 mA. In this case, when the wiring W1 and the wiring W2 are normal, V1=(4008/8008)×(VDD−VSS) is obtained from Equation (1), and V2=(4000/8008)×(VDD−VSS) is obtained from Equation (2). On the other hand, when the wiring W1 and the wiring W2 are short-circuited, V1=V2=(VDD−VSS)/2. Therefore, differences between the voltages V1 and V2 when the wiring W1 and the wiring W2 are normal and when the wiring W1 and the wiring W2 are short-circuited are about 1 mV, and are required to be about 1 mV as measurement resolutions of the voltages V1 and V2. When the measurement resolutions are implemented by A/D converters, 10 bits or more may be required, and a circuit area of the coupling inspection circuit 90 may be significantly increased. Therefore, in the embodiment, an increase amount of the circuit area of the coupling inspection circuit 90 is reduced by measuring the voltages V1 and V2 using the voltage-controlled oscillator 96 and the counter 97.

Figure 11:
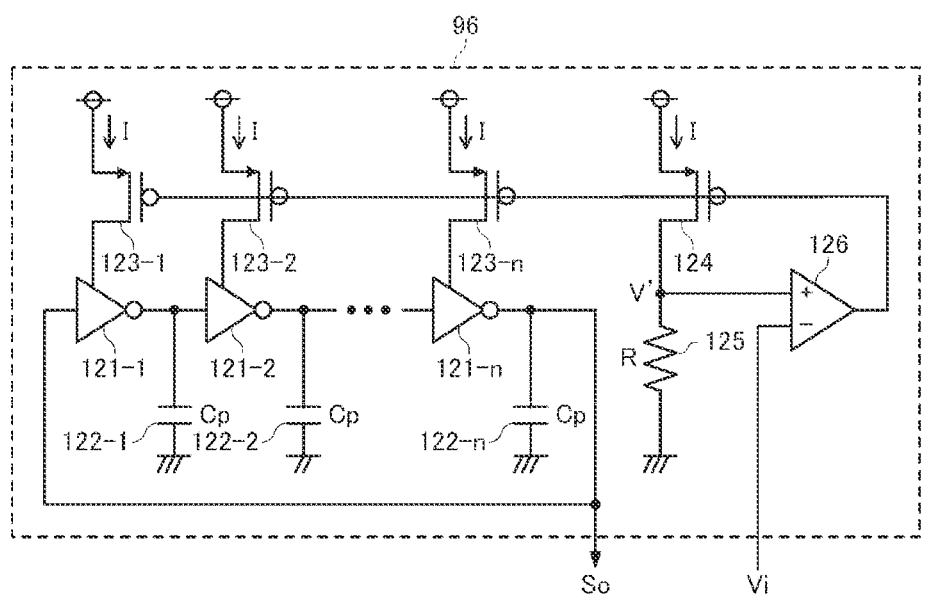
FIG. 11 is a diagram showing a configuration example of a voltage-controlled oscillator.

FIG. 11 is a diagram showing a configuration example of the voltage-controlled oscillator 96. In the example in FIG. 11, the voltage-controlled oscillator 96 includes n logic inversion circuits 121-1 to 121-$n$, n capacitors 122-1 to 122-$n$, n PMOS transistors 123-1 to 123-$n$, a PMOS transistor 124, a resistor 125, and an operational amplifier 126. n is an odd number of one or more.

In the example in FIG. 11, an output terminal of the logic inversion circuit 121-$j$ and an input terminal of the logic inversion circuit 121-($j$+1) are coupled to each other, and an input terminal of the logic inversion circuit 121-1 and an output terminal of the logic inversion circuit 121-$n$ are coupled to each other. j is an integer of one or more and n or less. Further, a power supply terminal of the logic inversion circuit 121-j and a drain of the PMOS transistor 123-j are coupled to each other, and the capacitor 122-j is coupled between the output terminal of the logic inversion circuit 121-j and ground. In this way, the n logic inversion circuits 121-1 to 121-n are coupled in series to constitute an oscillation loop, and an output signal of the logic inversion circuit 121-n is output from the voltage-controlled oscillator 96 as an oscillation signal So.

Sources of the PMOS transistors 123-1 to 123-n and 124 are coupled to power supplies, and gates of the PMOS transistors 123-1 to 123-n and 124 are coupled to an output terminal of the operational amplifier 126. Therefore, since gate-source voltages of the PMOS transistors 123-1 to 123-n and 124 are equal to one another, the same current I flows between the source and the drain.

A drain of the PMOS transistor 124, one end of the resistor 125, and a non-inverting input terminal of the operational amplifier 126 are coupled to one another, and the other end of the resistor 125 is coupled to the ground. An input voltage Vi of the voltage-controlled oscillator 96 is applied to an inverting input terminal of the operational amplifier 126.

In the voltage-controlled oscillator 96 implemented in this way, the current I changes such that a voltage V' of the non-inverting input terminal of the operational amplifier 126 coincides with the input voltage Vi applied to the inverting input terminal of the operational amplifier 126. As the current I changes, a frequency fo of the oscillation signal So changes. When a value of the resistor 125 is R, values of the capacitors 122-1 to 122-n are all Cp, and intermediate voltages of output signals of the logic inversion circuits 121-1 to 121-n are all Vcp, the frequency fo of the oscillation signal So is calculated by Equation (3). In Equation (3), k is a constant determined by a manufacturing process of the semiconductor device 1, the circuit configuration of the voltage-controlled oscillator 96, and the like, and is, for example, about 0.5. Based on (3), the higher the input voltage Vi, the higher the frequency fo of the oscillation signal So.

$$fo = \frac{k \cdot I}{Cp \cdot Vcp \cdot n} = \frac{k \cdot Vin}{Cp \cdot Vcp \cdot n \cdot R} \qquad (3)$$

Returning to the description of FIG. 10, a first input terminal of the switch 95 is coupled to the node N1, a second input terminal of the switch 95 is coupled to the node N2, and an output terminal of the switch 95 is coupled to an input terminal of the voltage-controlled oscillator 96.

In the inspection mode, first, the first input terminal and the output terminal of the switch 95 are conducted, and the voltage V1 of the node N1 is input as the input voltage Vi to the voltage-controlled oscillator 96. As a result, the voltage-controlled oscillator 96 oscillates at a frequency f1 according to the voltage V1, and outputs the oscillation signal So of the frequency fo=f1. Next, the second input terminal and the output terminal of the switch 95 are conducted, and the voltage V2 of the node N2 is input as the input voltage Vi to the voltage-controlled oscillator 96. As a result, the voltage-controlled oscillator 96 oscillates at a frequency f2 according to the voltage V2, and outputs the oscillation signal So of the frequency fo=f2. In this way, in the voltage-controlled oscillator 96, the frequency fo changes according to the voltage V1 of the coupling node N1 between the resistor 91 and the resistor 200 or the voltage V2 of the coupling node N2 between the resistor 92 and the resistor 200.

When the first input terminal and the output terminal of the switch 95 are conducted, the counter 97 counts the number of pulses of the oscillation signal So of the frequency fo=f1 output from the voltage-controlled oscillator 96 in a predetermined period, and stores a count value C1. Further, when the second input terminal and the output terminal of the switch 95 are conducted, the counter 97 counts the number of pulses of the oscillation signal So of the frequency fo=f2 output from the voltage-controlled oscillator 96 in a predetermined period, and stores a count value C2.

The comparison circuit 98 compares the count value C1 stored by the counter 97 with reference values RA1, RB1, RC1, and RD1. Further, the comparison circuit 98 compares the count value C2 stored by the counter 97 with reference values RA2, RB2, RC2, and RD2. The reference values RA1 and RA2 are count values of the counter 97 expected for the voltages V1 and V2 when the wirings W1 and W2 are normal. The reference values RB1 and RB2 are count values of the counter 97 expected for the voltages V1 and V2 when the wiring W1 or W2 is decoupled. The reference values RC1 and RC2 are count values of the counter 97 expected for the voltages V1 and V2 when the wirings W1 and W2 are grounded. The reference values RD1 and RD2 are count values of the counter 97 expected for the voltages V1 and V2 when the wirings W1 and W2 are short-circuited.

When the count value C1 and the reference value RA1 coincide with each other and the count value C2 and the reference value RA2 coincide with each other, the comparison circuit 98 generates a flag signal FL3 indicating that the wirings W1 and W2 are normal. Further, when the count value C1 and the reference value RB1 coincide with each other and the count value C2 and the reference value RB2 coincide with each other, the comparison circuit 98 generates the flag signal FL3 indicating that the wiring W1 or W2 is decoupled. Further, when the count value C1 and the reference value RC1 coincide with each other and the count value C2 and the reference value RC2 coincide with each other, the comparison circuit 98 generates the flag signal FL3 indicating that the wirings W1 and W2 are grounded. Further, when the count value C1 and the reference value RD1 coincide with each other and the count value C2 and the reference value RD2 coincide with each other, the comparison circuit 98 generates the flag signal FL3 indicating that the wirings W1 and W2 are short-circuited.

In this way, in the embodiment, the coupling inspection circuit 90 inspects the coupling between the amplifier circuit 50 and the sound reproduction device 3 based on the oscillation signal So output from the voltage-controlled oscillator 96.

As shown in FIG. 9, when receiving a command for reading the flag signal FL3 from the micro control unit 2, the communication interface circuit 10 acquires the flag signal FL3 from the coupling inspection circuit 90 and transmits the flag signal FL3 to the micro control unit 2. For example, the micro control unit 2 can determine a coupling state between the amplifier circuit 50 and the sound reproduction device 3 based on the flag signal FL3. Specifically, based on the flag signal FL3, the micro control unit 2 can determine whether the wirings W1 and W2 are normal, whether the wiring W1 or W2 is decoupled, whether the wirings W1 and W2 are grounded, and whether the wirings W1 and W2 are short-circuited.

Since other configurations of the semiconductor device 1 according to the second embodiment are similar to those in FIG. 1, description thereof will be omitted.

In the second embodiment, the sound source signal DI is an example of the "first sound source signal", the sigma-delta modulated signal DS is an example of the "first sigma-delta modulated signal", and the pulse-width modulated signals DOP and DON are examples of the "first pulse-width modulated signal". Further, the modulation circuit 30 is an example of the "first modulation circuit", and the modulation circuit 40 is an example of the "second modulation circuit". Further, the modulation inspection circuit 60 is an example of the "first modulation inspection circuit", and the modulation inspection circuit 70 is an example of the "second modulation inspection circuit".

According to the semiconductor device 1 in the second embodiment described above, effects similar to those of the semiconductor device 1 according to the first embodiment are achieved. Further, according to the semiconductor device 1 in the second embodiment, not only the sound source reproduction circuit 100 including the modulation circuit 30, the modulation circuit 40, and the amplifier circuit 50 can be inspected, but also the coupling between the sound source reproduction circuit 100 and the sound reproduction device 3 can be inspected.

According to the semiconductor device 1 in the second embodiment, by using the voltage-controlled oscillator 96, the voltages V1 and V2 of the coupling nodes N1 and N2 between the inspection resistors 91 and 92 and the internal resistor 200 of the sound reproduction device 3 can be measured using the high resolution. Therefore, the inspection resistors 91 and 92 can be made sufficiently larger than the internal resistor 200 of the sound reproduction device 3, and current consumption during the inspection of the coupling between the sound source reproduction circuit 100 and the sound reproduction device 3 can be reduced.

1-3. Third Embodiment

Hereinafter, for the semiconductor device 1 according to the third embodiment, configurations similar to those of the first embodiment or the second embodiment are denoted by the same reference numerals, description similar to that of the first embodiment or the second embodiment will be omitted or simplified, and content different from that of the first embodiment and the second embodiment will be mainly described.

Figure 12:
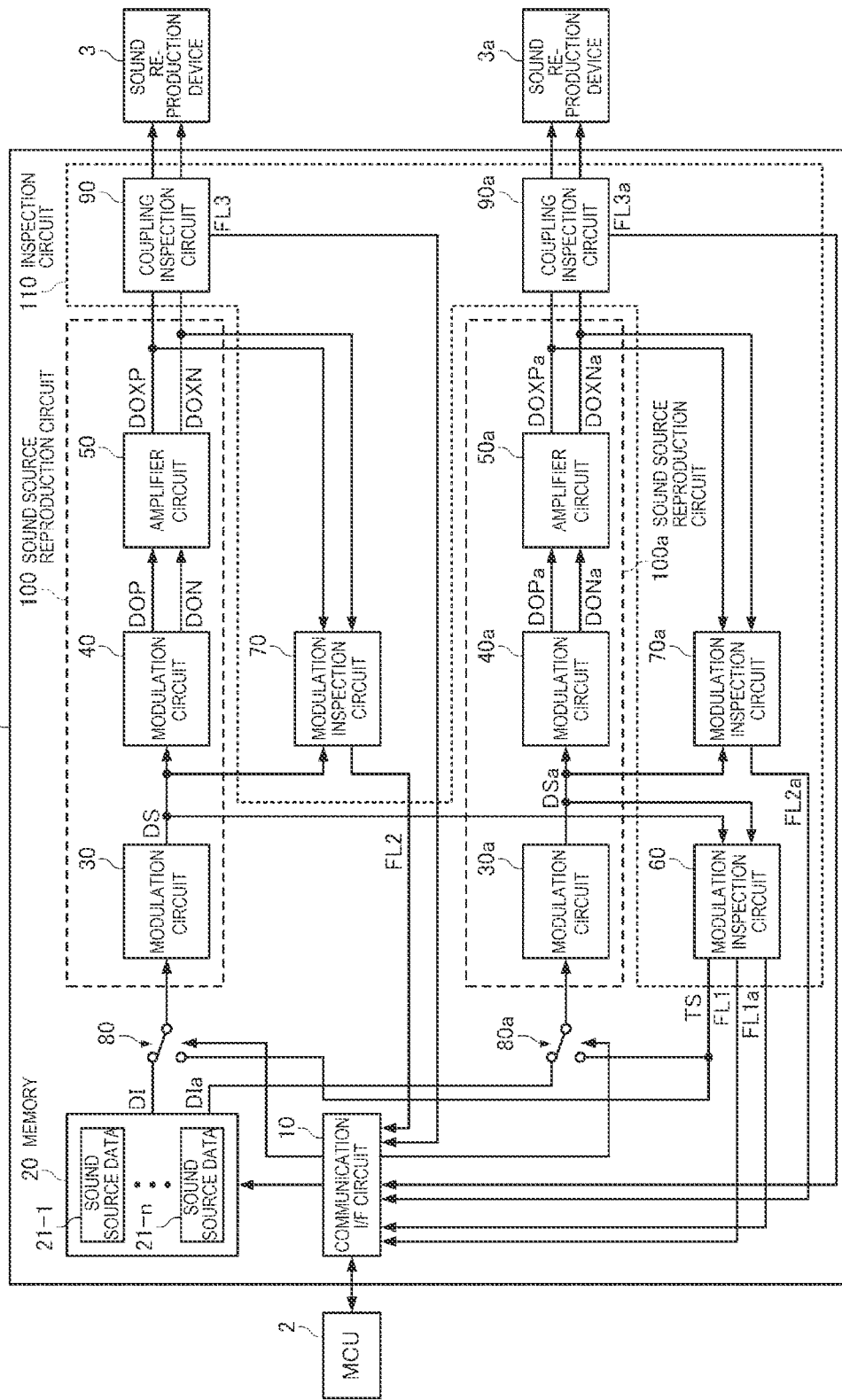
FIG. 12 is a diagram showing a configuration example of a semiconductor device according to a third embodiment.

FIG. 12 is a diagram showing a configuration example of the semiconductor device 1 according to the third embodiment. As shown in FIG. 12, the semiconductor device 1 according to the third embodiment is different from the semiconductor device 1 according to the second embodiment shown in FIG. 9 in that a switch 80a, a modulation circuit 30a, a modulation circuit 40a, and an amplifier circuit 50a are provided and a sound source reproduction circuit 100a coupled to a sound reproduction device 3a is provided, and in that a sound source signal DIa is received from the memory 20 to the sound source reproduction circuit 100a. Further, the semiconductor device 1 according to the third embodiment is different from the semiconductor device 1 according to the second embodiment in that the inspection circuit 110 includes a modulation inspection circuit 70a and a coupling inspection circuit 90a, and in that the modulation inspection circuit 60 inspects not only the modulation circuit 30 but also the modulation circuit 30a.

When receiving a command for reproducing sound source data 21-i that is any one of the sound source data 21-1 to 21-n stored in the memory 20 by the sound reproduction device 3, the communication interface circuit 10 reads the sound source data 21-i from the memory 20, inputs the sound source data 21-i to the sound source reproduction circuit 100 as the sound source signal DI, and instructs the sound source reproduction circuit 100 to reproduce the sound source data 21-i. Further, when receiving a sound source stop command for the sound source data 21-i during the reproduction, the communication interface circuit 10 instructs the sound source reproduction circuit 100 to stop the reproduction. Further, when receiving a command for reproducing sound source data 21-j that is any one of the sound source data 21-1 to 21-n stored in the memory 20 by the sound reproduction device 3a, the communication interface circuit 10 reads the sound source data 21-j from the memory 20, inputs the sound source data 21-j to the sound source reproduction circuit 100a as the sound source signal DIa, and instructs the sound source reproduction circuit 100a to reproduce the sound source data 21-j. Further, when receiving the sound source stop command for the sound source data 21-j during the reproduction, the communication interface circuit 10 instructs the sound source reproduction circuit 100a to stop the reproduction. Further, when receiving various setting commands related to the sound source reproduction, the communication interface circuit 10 performs various settings on the sound source reproduction circuit 100 or the sound source reproduction circuit 100a.

In response to a control signal output from the communication interface circuit 10, the switch 80a outputs either one of the sound source signal DIa and the test signal TS to the sound source reproduction circuit 100a. Specifically, the sound source signal DIa is input to the sound source reproduction circuit 100 in the normal operation mode, and the test signal TS is input to the sound source reproduction circuit 100 in the inspection mode.

In the embodiment, the sound source signal DIa input to the sound source reproduction circuit 100a is the pulse-code modulated signal. When the sound source data 21-1 to 21-n is compressed sound data or adaptive differential pulse-code modulated sound data, the sound source data 21-j that is a reproduction target is converted into the sound source signal DIa that is the pulse-code modulated signal by a decoder (not shown).

The sound source reproduction circuit 100a converts the sound source signal DIa into amplified signals DOXPa and DOXNa that are sound signals, and outputs the amplified signals DOXPa and DOXNa to the sound reproduction device 3a coupled to the semiconductor device 1. Accordingly, sounds corresponding to the amplified signals DOXPa and DOXNa are output from the sound reproduction device 3a. For example, the sound reproduction device 3a may be a speaker or a buzzer. The sound output from the sound reproduction device 3a may be, for example, a sound imitating a voice when a person speaks, or may be various sounds such as a mechanical warning sound or a sound effect.

As shown in FIG. 12, in the embodiment, the sound source reproduction circuit 100a includes the modulation circuit 30a, the modulation circuit 40a, and the amplifier circuit 50a.

The modulation circuit 30a receives the sound source signal DIa, sigma-delta modulates a signal based on the sound source signal DIa, and outputs a sigma-delta modulated signal DSa. The signal based on the sound source signal DIa may be the sound source signal DIa itself, or may be a signal obtained by performing some processing on the sound source signal DIa. Since the configuration and the function of the modulation circuit 30a are similar to those of the modulation circuit 30, description thereof will be omitted.

The modulation circuit 40a receives the sigma-delta modulated signal DSa, pulse-width modulates a signal based on the sigma-delta modulated signal DSa, and outputs pulse-width modulated signals DOPa and DONa. The signal based on the sigma-delta modulated signal DSa may be the sigma-delta modulated signal DSa itself, or may be a signal obtained by performing some processing on the sigma-delta modulated signal DSa. Since the configuration and the function of the modulation circuit 40a are similar to those of the modulation circuit 40, description thereof will be omitted.

The amplifier circuit 50a receives the pulse-width modulated signals DOPa and DONa, and outputs the amplified signals DOXPa and DOXNa obtained by amplifying the pulse-width modulated signals DOPa and DONa to the sound reproduction device 3a. The sound reproduction device 3 reproduces a sound having a magnitude corresponding to a voltage difference between the amplified signal DOXPa and the amplified signal DOXNa. Since the configuration and the function of the amplifier circuit 50a are similar to those of the amplifier circuit 50, description thereof will be omitted.

The amplifier circuit 50 outputs the amplified signals DOXPa and DOXNa to the sound reproduction device 3a in the normal operation mode, and stops outputting the amplified signals DOXPa and DOXNa such that the sound reproduction device 3a does not generate a sound in the inspection mode.

The inspection circuit 110 is a circuit that inspects the sound source reproduction circuit 100 and the sound source reproduction circuit 100a. As shown in FIG. 12, in the embodiment, the inspection circuit 110 includes the modulation inspection circuit 60, the modulation inspection circuit 70, the modulation inspection circuit 70a, the coupling inspection circuit 90, and the coupling inspection circuit 90a.

The modulation inspection circuit 60 inspects the modulation circuit 30 and the modulation circuit 30a in the inspection mode.

The modulation inspection circuit 60 generates at least one of the impulse signal and the step signal as the test signal TS, and inputs the test signal TS to the modulation circuits 30 and 30a via the switches 80 and 80a. Therefore, the modulation circuits 30 and 30a respectively output the sigma-delta modulated signals DS and DSa obtained by sigma-delta modulating the test signal TS in the inspection mode.

The modulation inspection circuit 60 compares the sigma-delta modulated signals DS and DSa with the expected value signal. The modulation inspection circuit 60 generates the flag signal FL1 indicating whether the sigma-delta modulated signal DS coincides with the expected value signal and a flag signal FL1a indicating whether the sigma-delta modulated signal DSa coincides with the expected value signal.

In this way, in the inspection mode, the modulation inspection circuit 60 inputs, instead of the sound source signals DI and Dia, at least one of the impulse signal and the step signal to the modulation circuits 30 and 30a, and inspects the modulation circuits 30 and 30a based on signals output from the modulation circuits 30 and 30a. The modulation inspection circuit 60 may inspect the modulation circuits 30 and 30a simultaneously or in a time-division manner.

When receiving a command for reading the flag signal FL1a from the micro control unit 2, the communication interface circuit 10 acquires the flag signal FL1a from the modulation inspection circuit 60, and transmits the flag signal FL1a to the micro control unit 2. For example, the micro control unit 2 can determine presence or absence of a failure in the modulation circuit 30a based on the flag signal FL1a.

The amplifier circuit 50a stops outputting the amplified signals DOXPa and DOXNa in the inspection mode such that the sound reproduction device 3a does not generate an abnormal sound corresponding to the test signal TS.

The modulation inspection circuit 70a inspects the modulation circuit 40a in the inspection mode. Further, the modulation inspection circuit 70a also inspects the amplifier circuit 50a in the inspection mode. The modulation inspection circuit 70a generates a flag signal FL2a. Since the configuration and the function of the modulation inspection circuit 70a are similar to those of the modulation inspection circuit 70, description thereof will be omitted. The modulation inspection circuit 70a can inspect the modulation circuit 40a even when the sound reproduction device 3a reproduces a sound corresponding to the sound source signal DIa in the normal mode.

When receiving a command for reading the flag signal FL2a from the micro control unit 2, the communication interface circuit 10 acquires the flag signal FL2a from the modulation inspection circuit 70a, and transmits the flag signal FL2a to the micro control unit 2. For example, the micro control unit 2 can determine presence or absence of a failure in the modulation circuit 40a based on the flag signal FL2a.

As shown in FIG. 12, in the embodiment, the modulation inspection circuit 60, the modulation inspection circuit 70, and the modulation inspection circuit 70a are separated. That is, the modulation inspection circuit 60 is a circuit specialized in inspecting the modulation circuits 30 and 30a, and does not inspect the modulation circuits 40 and 40a. Similarly, the modulation inspection circuit 70 is a circuit specialized in inspecting the modulation circuit 40, and does not inspect the modulation circuits 30, 30a, and 40a. Similarly, the modulation inspection circuit 70a is a circuit specialized in inspecting the modulation circuit 40a, and does not inspect the modulation circuits 30, 30a, and 40. Therefore, the micro control unit 2 can determine presence or absence of failures in the modulation circuits 30 and 30a by the flag signals FL1 and FL1a generated by the modulation inspection circuit 60, determine presence or absence of a failure in the modulation circuit 40 by the flag signal FL2 generated by the modulation inspection circuit 70, and determine presence or absence of a failure in the modulation circuit 40a by the flag signal FL2a generated by the modulation inspection circuit 70a.

The coupling inspection circuit 90a is provided between the amplifier circuit 50a and the sound reproduction device 3a, and inspects the coupling between the amplifier circuit 50a and the sound reproduction device 3a in the inspection mode. The coupling inspection circuit 90a generates a flag signal FL3a. Since the configuration and the function of the coupling inspection circuit 90a are similar to those of the coupling inspection circuit 90, description thereof will be omitted. As described above, the amplifier circuit 50a stops outputting the amplified signals DOXPa and DOXNa such that the sound reproduction device 3a does not generate an abnormal sound in the inspection mode.

When receiving a command for reading the flag signal FL3a from the micro control unit 2, the communication interface circuit 10 acquires the flag signal FL3a from the coupling inspection circuit 90a and transmits the flag signal FL3a to the micro control unit 2. For example, the micro control unit 2 can determine a coupling state between the amplifier circuit 50a and the sound reproduction device 3a based on the flag signal FL3a.

Since other configurations of the semiconductor device 1 according to the third embodiment are similar to those in FIG. 9, description thereof will be omitted.

In the third embodiment, the sound source signal DI is an example of the "first sound source signal", and the sound source signal DIa is an example of a "second sound source signal". Further, the sigma-delta modulated signal DS is an example of the "first sigma-delta modulated signal", and the sigma-delta modulated signal DSa is an example of a "second sigma-delta modulated signal". Further, the pulse-width modulated signals DOP and DON are examples of the "first pulse-width modulated signal", and the pulse-width modulated signals DOPa and DONa are examples of a "second pulse-width modulated signal". Further, the modulation circuit 30 is an example of the "first modulation circuit", the modulation circuit 40 is an example of the "second modulation circuit", the modulation circuit 30a is an example of a "third modulation circuit", and the modulation circuit 40a is an example of a "fourth modulation circuit". Further, the modulation inspection circuit 60 is an example of the "first modulation inspection circuit", the modulation inspection circuit 70 is an example of the "second modulation inspection circuit", and the modulation inspection circuit 70a is an example of a "third modulation inspection circuit".

The semiconductor device 1 according to the third embodiment is able to output sounds to the two sound reproduction devices 3 and 3a, and may be able to output sounds to three or more sound output devices.

According to the semiconductor device 1 in the third embodiment described above, effects similar to those of the semiconductor device 1 according to the second embodiment are achieved. Further, in the semiconductor device 1 according to the third embodiment, the sound source reproduction circuit 100 including the modulation circuit 30, the modulation circuit 40, and the amplifier circuit 50 can cause the sound reproduction device 3 to generate the sound corresponding to the sound source signal DI, and the sound source reproduction circuit 100a including the modulation circuit 30a, the modulation circuit 40a, and the amplifier circuit 50a can cause the sound reproduction device 3a to generate the sound corresponding to the sound source signal DIa. That is, according to the semiconductor device 1 in the third embodiment, the sounds corresponding to the two types of sound source signals DI and DIa can be reproduced simultaneously, and an increase amount of a size of the inspection circuit 110 is reduced using the modulation inspection circuit 60 for both the inspection of the modulation circuit 30 and the inspection of the modulation circuit 30a.

In the semiconductor device 1 according to the third embodiment, since the modulation inspection circuit 60, the modulation inspection circuit 70, and the modulation inspection circuit 70a are separated from one another, the inspection of the modulation circuits 30 and 30a performed by the modulation inspection circuit 60, the inspection of the modulation circuit 40 performed by the modulation inspection circuit 70, and the inspection of the modulation circuit 40a performed by the modulation inspection circuit 70a are performed independently of one another. Therefore, the micro control unit 2 can detect failures in the modulation circuits 30 and 30a based on the flag signal FL1 output from the modulation inspection circuit 60, detect a failure in the modulation circuit 40 based on the flag signal FL2 output from the modulation inspection circuit 70, and detect a failure in the modulation circuit 40a based on the flag signal FL2a output from the modulation inspection circuit 70a.

According to the semiconductor device 1 in the third embodiment, not only the sound source reproduction circuit 100a including the modulation circuit 30a, the modulation circuit 40a, and the amplifier circuit 50a can be inspected, but also the coupling between the sound source reproduction circuit 100a and the sound reproduction device 3a can be inspected.

1-4. Modifications

The present disclosure is not limited to the embodiments, and various modifications can be made within a scope of gist of the present disclosure.

For example, in the embodiments described above, the amplified signals DOXP and DOXN are input to the modulation inspection circuit 70. Alternatively, the pulse-width modulated signals DOP and DON may be input to the modulation inspection circuit 70. In this case, the binarization circuits 71P and 71N are not necessary, and the conversion circuit 72 may convert the pulse-width modulated signals DOP and DON into the pulse-code modulated signal DX.

For example, in the embodiments described above, the memory 20 in which the sound source data 21-1 to 21-n is stored is incorporated into the semiconductor device 1. Alternatively, instead of using the memory 20, an external memory in which the sound source data 21-1 to 21-n is stored may be coupled to the semiconductor device 1, and the semiconductor device 1 may read the sound source data 21-i that is the sound source signal DI from the external memory. Alternatively, instead of using the memory 20, the micro control unit 2 may incorporate a memory in which the sound source data 21-1 to 21-n is stored, and the micro control unit 2 may read the sound source data 21-i from the memory and transmit the sound source data 21-i to the semiconductor device 1 as the sound source signal DI.

Figure 13:
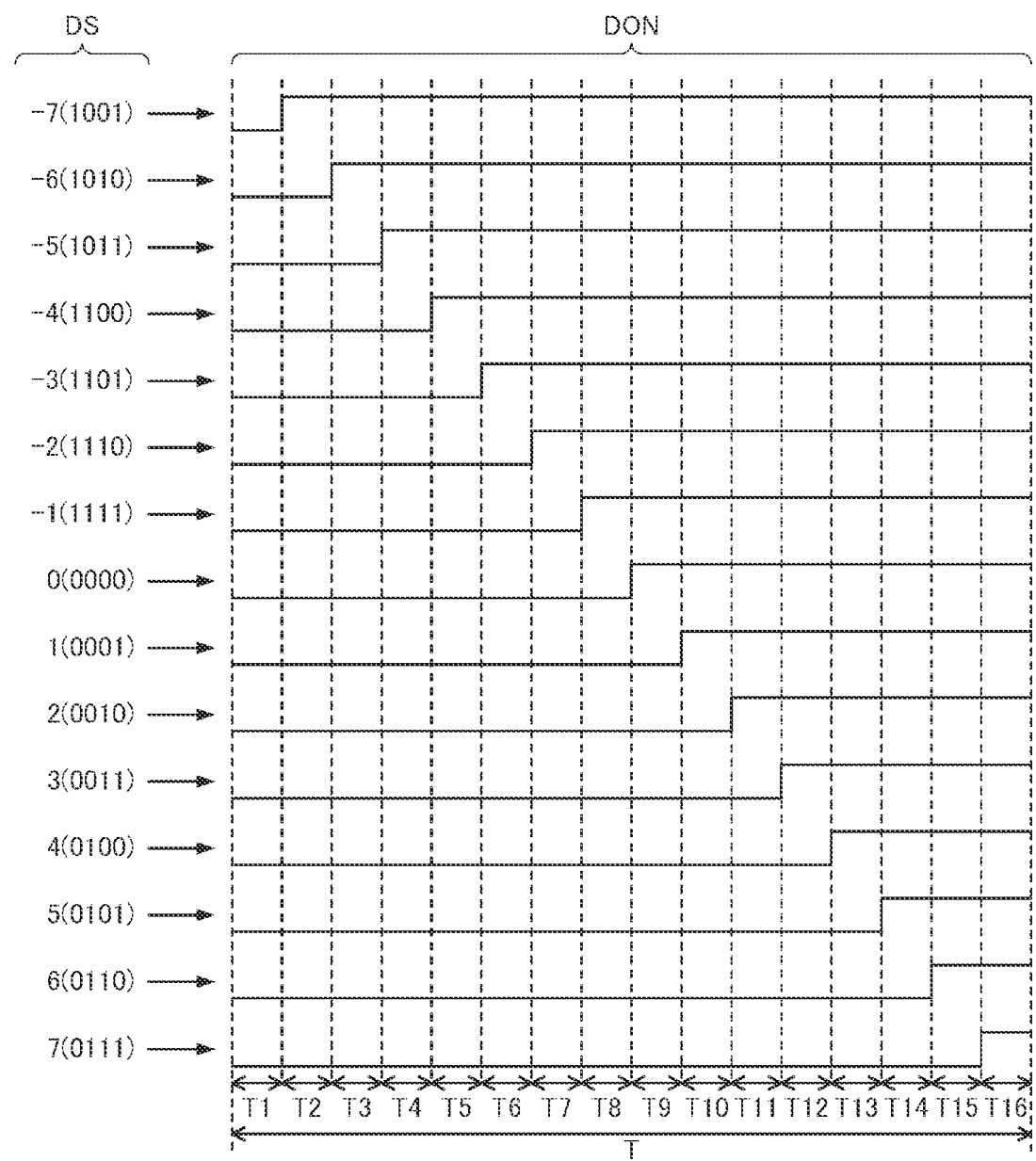
FIG. 13 is a diagram showing another example of the pulse-width modulation for generating the pulse-width modulated signal DON.

For example, in the embodiments described above, the examples in FIGS. 2 to 4 are given as the modulation method performed by the pulse-width modulation circuit 41. Alternatively, other modulation methods may be used. For example, pulse-width modulation for generating the pulse-width modulated signal DOP may use a method the same as that in FIG. 2, and pulse-width modulation for generating the pulse-width modulated signal DON may use the method shown in FIG. 13. In an example in FIG. 13, the pulse-width modulated signal DON is a signal obtained by inverting a logic level of the pulse-width modulated signal DOP shown in FIG. 2, and the larger the value of the sigma-delta modulated signal DS is, the shorter the high-level time is. For example, when the sigma-delta modulated signal DS is decimal "−7", that is, binary "1001", the pulse-width modulated signal DON is at a low level in the section T1, and is at a high level in the 15 sections T2 to T16. Further, for example, when the sigma-delta modulated signal DS is decimal "0", that is, binary "0000", the pulse-width modulated signal DON is at the low level in the 8 sections T1 to T8, and is at the high level in the 8 sections T9 to T16. Further, for example, when the sigma-delta modulated signal DS is decimal "7", that is, binary "0111", the pulse-width modulated signal DON is at the low level in the 15 sections T1 to T15, and is at the high level in the section T16.

Figure 14:
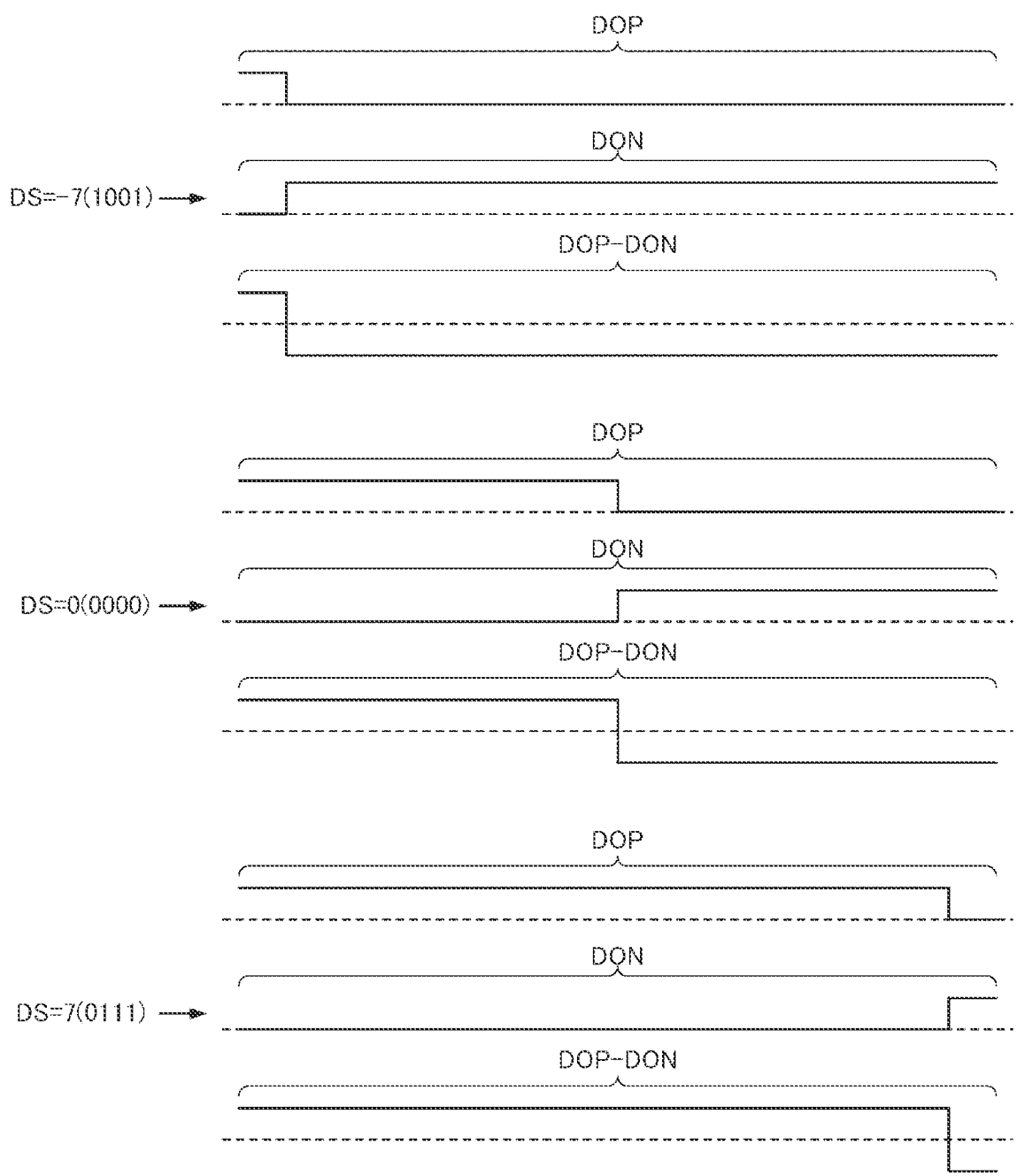
FIG. 14 is a diagram showing another example of the difference between the pulse-width modulated signal DOP and the pulse-width modulated signal DON.

Therefore, for example, a difference between the pulse-width modulated signal DOP and the pulse-width modulated signal DON when the sigma-delta modulated signal DS is decimal "−7", "0", or "7" is as shown in FIG. 14.

2. Electronic Apparatus

Figure 15:
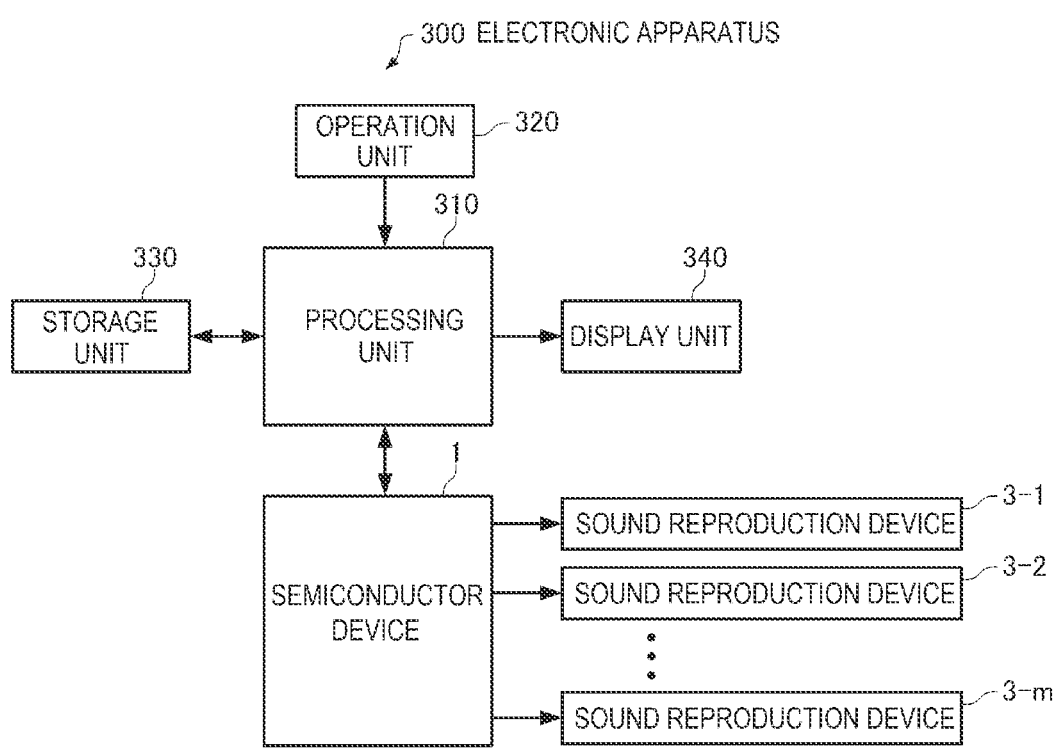
FIG. 15 is a functional block diagram of an electronic apparatus according to the embodiment.

FIG. 15 is a functional block diagram showing an example of a configuration of the electronic apparatus according to the embodiment using the semiconductor device 1 according to the embodiments.

As shown in FIG. 15, an electronic apparatus 300 according to the embodiment includes the semiconductor device 1, m sound reproduction devices 3-1 to 3-*m*, a processing unit 310, an operation unit 320, a storage unit 330, and a display unit 340. The electronic apparatus 300 according to the embodiment may have a configuration in which some constituent elements in FIG. 15 are omitted or changed, or in which other constituent elements are added.

The processing unit 310 performs control processing and various kinds of data processing of the units of the electronic apparatus 300. For example, the processing unit 310 transmits various commands to the semiconductor device 1, and controls an operation of the semiconductor device 1. Further, the processing unit 310 performs various kinds of processing in response to an operation signal from the operation unit 320, processing of transmitting a display signal for displaying various kinds of information on the display unit 340, and the like. For example, the processing unit 310 may be the micro control unit 2 described above.

The operation unit 320 is an input device implemented by operation keys, button switches, and the like, and outputs an operation signal in response to an operation performed by a user to the processing unit 310.

The storage unit 330 stores programs, data, and the like for performing various kinds of calculation processing and control processing by the processing unit 310. The storage unit 330 is implemented by, for example, a hard disk, a flexible disk, an MO, an MT, various memories, a CD-ROM, or a DVD-ROM.

The display unit 340 is a display device implemented by an LCD or the like, and displays various kinds of information based on an input display signal. The LCD is an abbreviation for a liquid crystal display. A touch panel that functions as the operation unit 320 may be provided in the display unit 340.

The semiconductor device 1 generates a sound signal based on various commands transmitted from the processing unit 310, and outputs the generated sound signal to the sound reproduction device 3-1. The sound reproduction device 3-1 corresponds to the sound reproduction device 3 described above. Further, the semiconductor device 1 may inspect the sound source reproduction circuit 100 described above and transmit an inspection result to the processing unit 310, and the processing unit 310 may determine presence or absence of a failure in the sound source reproduction circuit 100. Alternatively, when the failure in the sound source reproduction circuit 100 is detected, the semiconductor device 1 may switch an output destination of the sound signal from the sound reproduction device 3-1 to the sound reproduction device 3-2. The sound reproduction device 3-2 corresponds to the sound reproduction device 3*a* described above.

Since the semiconductor device 1 can inspect the sound source reproduction circuit 100 by the inspection circuit 110 having a relatively small size, the semiconductor device 1 is advantageous in reducing a cost of the electronic apparatus 300.

As such an electronic apparatus 300, various electronic apparatuses are considered, and examples thereof include: various household electrical appliances such as a warning device, a rice cooker, an IH cooking heater, a vacuum cleaner, and a washing machine, an electronic timepiece, a personal computer such as a mobile computer, a laptop computer, or a tablet computer, a mobile terminal such as a smartphone or a mobile phone, an inkjet ejection device such as a digital camera or an inkjet printer, a storage area network apparatus such as a router or a switch, a local area network apparatus, a mobile terminal base station apparatus, a television, a video camera, a video recorder, a car navigation device, a real-time clock device, a pager, an electronic notebook, an electronic dictionary, a calculator, an electronic game apparatus, a game controller, a word processor, a workstation, a videophone, a crime prevention television monitor, electronic binoculars, a POS terminal, a medical apparatus such as an electronic clinical thermometer, a sphygmomanometer, a blood glucose meter, an electrocardiogram measurement device, an ultrasonic diagnostic device, or an electronic endoscope, a fish finder, various measurement apparatuses, meters of a vehicle, an aircraft, a ship, or the like, a flight simulator, a head mounted display, a motion trace, a motion tracking, a motion controller, and a pedestrian self-navigating device.

Figure 16:
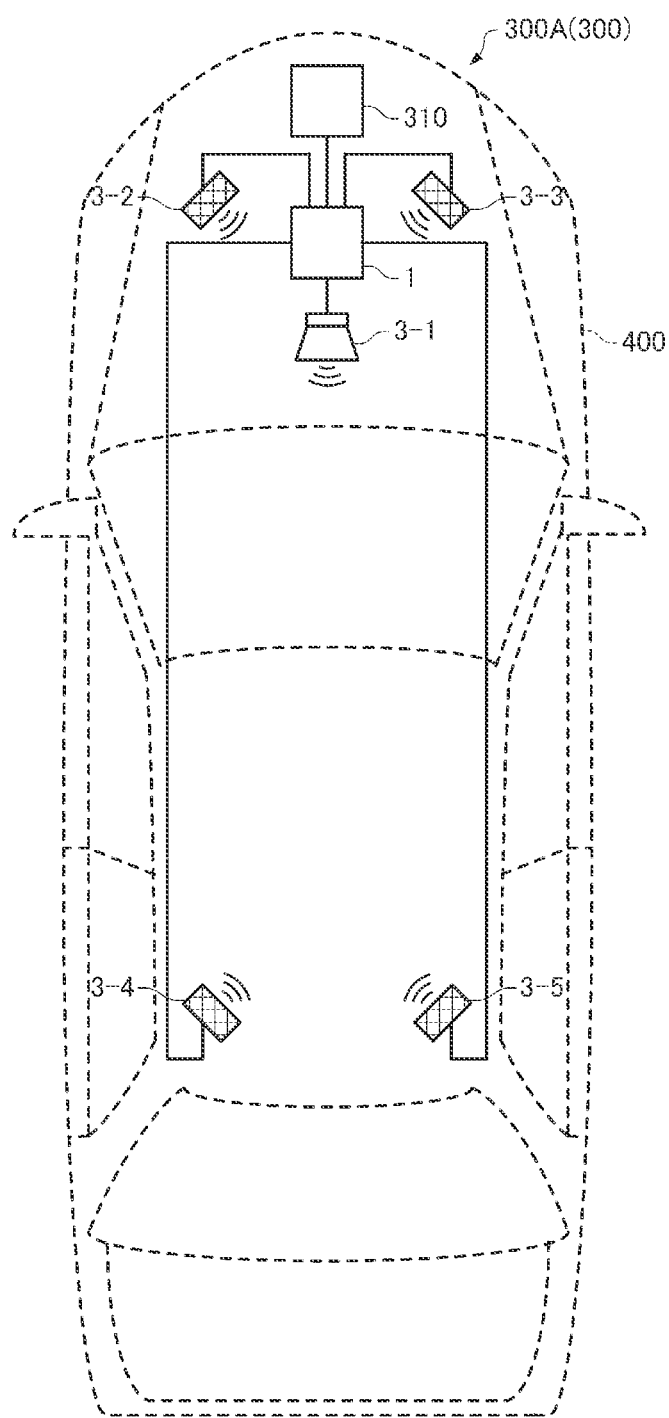
FIG. 16 is a diagram showing a configuration example of a warning device that is an example of the electronic apparatus.

FIG. 16 is a diagram showing a configuration example of a warning device 300A that is an example of the electronic apparatus 300. In FIG. 16, constituent elements the same as those in FIG. 15 are denoted by the same reference numerals. The warning device 300A shown in FIG. 16 is mounted on a vehicle 400. The sound reproduction device 3-1 is a speaker, and the sound reproduction devices 3-2 to 3-5 are buzzers.

The processing unit 310 transmits reproduction commands or the like of various sounds to the semiconductor device 1 based on signals from various sensors (not shown). Examples of the various sounds include a sound or a warning sound imitating a voice of a person for notifying an abnormality of a brake, engine oil, power steering, a brake override system, or the like, traveling with an ajar door, unsteady traveling, traveling without releasing a parking brake, not wearing a seatbelt, approaching a preceding vehicle, and the like, a sound effect for notifying a blinker, a hazard, backing, and the like.

Based on a command from the processing unit 310, the semiconductor device 1 generates a sound signal based on some of a plurality of pieces of sound source data corresponding to the various sounds, and outputs the generated sound signal to the sound reproduction device 3-1. Further, the semiconductor device 1 may inspect the sound source reproduction circuit 100 described above and transmit an inspection result to the processing unit 310, and the processing unit 310 may determine presence or absence of a failure in the sound source reproduction circuit 100. Alternatively, when the failure in the sound source reproduction circuit 100 is detected, the semiconductor device 1 may switch an output destination of the sound signal from the sound reproduction device 3-1 to the sound reproduction device 3-2.

Since the semiconductor device 1 can inspect the sound source reproduction circuit 100 by the inspection circuit 110 having a relatively small size, the semiconductor device 1 is advantageous in reducing a cost of the warning device 300A.

The present disclosure is not limited to the embodiment, and various modifications can be made within a scope of gist of the present disclosure.

The embodiments and the modifications described above are examples, and are not limited thereto. For example, the embodiments and the modifications can be combined as appropriate.

The present disclosure includes a configuration substantially the same as the configurations described in the embodiments, for example, a configuration having the same function, method, and result, or a configuration having the same object and effects. Further, the present disclosure includes a configuration obtained by replacing a non-essential part of the configurations described in the embodiments. Further, the present disclosure includes a configuration that achieves operations and effects the same as those of the configurations described in the embodiments, or a configuration that can achieve the same object. Further, the present disclosure includes a configuration obtained by adding a well-known technique to the configurations described in the embodiments.

The following content is derived from the embodiments and the modifications described above.

A semiconductor device according to an aspect includes:
a first modulation circuit configured to receive a first sound source signal, sigma-delta modulate a signal based on the first sound source signal, and output a first sigma-delta modulated signal;
a second modulation circuit configured to pulse-width modulate a signal based on the first sigma-delta modulated signal, and output a first pulse-width modulated signal;
a first modulation inspection circuit configured to inspect the first modulation circuit; and
a second modulation inspection circuit configured to inspect the second modulation circuit, in which
the first modulation inspection circuit and the second modulation inspection circuit are separated from each other.

In the semiconductor device, since the first modulation circuit modulates the first sound source signal into the first sigma-delta modulated signal by digital signal processing, the first modulation inspection circuit can inspect the first modulation circuit by digital processing. Further, since the second modulation circuit modulates the first sigma-delta modulated signal into the first pulse-width modulated signal by digital signal processing, the second modulation inspection circuit can inspect the second modulation circuit by digital processing. Therefore, according to the semiconductor device, A/D converters are not required in the first modulation inspection circuit and the second modulation inspection circuit, and the sound source reproduction circuit including the first modulation circuit and the second modulation circuit can be inspected by a circuit having a relatively small size.

In the semiconductor device, since the first modulation inspection circuit and the second modulation inspection circuit are separated from each other, the inspection of the first modulation circuit performed by the first modulation inspection circuit and the inspection of the second modulation circuit performed by the second modulation inspection circuit are performed independently of each other. Therefore, for example, an external device can detect a failure in the first modulation circuit based on a signal output from the first modulation inspection circuit, and can detect a failure in the second modulation circuit based on a signal output from the second modulation inspection circuit.

In the semiconductor device according to the aspect, the first modulation circuit may sigma-delta modulate a signal obtained by performing digital filter processing on the first sound source signal, and output the first sigma-delta modulated signal.

In the semiconductor device according to the aspect, in an inspection mode, the first modulation inspection circuit may input, instead of the first sound source signal, at least one of an impulse signal and a step signal to the first modulation circuit, and inspect the first modulation circuit based on a signal output from the first modulation circuit.

According to the semiconductor device, when the first modulation inspection circuit inputs at least one of the impulse signal and the step signal to the first modulation circuit, the first modulation inspection circuit can accurately inspect the first modulation circuit that performs the digital filter processing based on the signal output from the first modulation circuit.

In the semiconductor device according to the aspect, the second modulation inspection circuit may compare a signal obtained by integrating signals based on the first pulse-width modulated signal in a predetermined cycle with the first sigma-delta modulated signal to inspect the second modulation circuit.

According to the semiconductor device, the second modulation inspection circuit can accurately inspect the second modulation circuit by comparing the signal obtained by converting the first pulse-width modulated signal without losing information by integrating the first pulse-width modulated signals with the first sigma-delta modulated signal.

The semiconductor device according to the aspect may further include:
an amplifier circuit configured to output an amplified signal obtained by amplifying the first pulse-width modulated signal to a sound reproduction device; and
a coupling inspection circuit configured to inspect coupling between the amplifier circuit and the sound reproduction device.

According to the semiconductor device, not only the sound source reproduction circuit including the first modulation circuit, the second modulation circuit, and the amplifier circuit can be inspected, but also the coupling between the sound source reproduction circuit and the sound reproduction device can be inspected.

In the semiconductor device according to the aspect, the coupling inspection circuit may include
an inspection resistor coupled in series to an internal resistor of the sound reproduction device between a power supply and ground, and
a voltage-controlled oscillator whose frequency changes according to a voltage of a coupling node between the inspection resistor and the internal resistor, and
the coupling inspection circuit may inspect the coupling between the amplifier circuit and the sound reproduction device based on an oscillation signal output from the voltage-controlled oscillator.

According to the semiconductor device, the voltage of the coupling node between the inspection resistor and the internal resistor of the sound reproduction device can be measured with a high resolution using the voltage-controlled oscillator. Therefore, current consumption during the inspection of the coupling between the sound source reproduction circuit and the sound reproduction device can be reduced by making the inspection resistor sufficiently larger than the internal resistor of the sound reproduction device.

The semiconductor device according to the aspect may further include:

a third modulation circuit configured to receive a second sound source signal, sigma-delta modulate a signal based on the second sound source signal, and output a second sigma-delta modulated signal;

a fourth modulation circuit configured to pulse-width modulate a signal based on the second sigma-delta modulated signal, and output a second pulse-width modulated signal; and a third modulation inspection circuit configured to inspect the fourth modulation circuit, in which the first modulation inspection circuit, the second modulation inspection circuit, and the third modulation inspection circuit may be separated from one another, and the first modulation inspection circuit may inspect the first modulation circuit and the third modulation circuit.

In the semiconductor device, the first sound source signal can be reproduced by the sound source reproduction circuit including the first modulation circuit and the second modulation circuit, and the second sound source signal can be reproduced by the sound source reproduction circuit including the third modulation circuit and the fourth modulation circuit. That is, according to the semiconductor device, the two types of sound source signals can be reproduced simultaneously, and an increase amount of a size of the inspection circuit is reduced by using the first modulation inspection circuit for both the inspection of the first modulation circuit and the inspection of the third modulation circuit.

In the semiconductor device, since the first modulation inspection circuit, the second modulation inspection circuit, and the third modulation inspection circuit are separated from one another, the inspection of the first modulation circuit and the third modulation circuit performed by the first modulation inspection circuit, the inspection of the second modulation circuit performed by the second modulation inspection circuit, and the inspection of the fourth modulation circuit performed by the third modulation inspection circuit are performed independently of one another. Therefore, for example, the external device can detect failures in the first modulation circuit and the third modulation circuit based on a signal output from the first modulation inspection circuit, detect a failure in the second modulation circuit based on a signal output from the second modulation inspection circuit, and detect a failure in the fourth modulation circuit based on a signal output from the third modulation inspection circuit.

An electronic apparatus according to an aspect includes: the semiconductor device according to the aspect; and a sound reproduction device, in which the semiconductor device includes an amplifier circuit configured to output an amplified signal obtained by amplifying the first pulse-width modulated signal to the sound reproduction device.

According to the electronic apparatus, since the semiconductor device that can inspect the sound source reproduction circuit by a circuit having a relatively small size is provided, the semiconductor device is advantageous in reducing a cost of the electronic apparatus.

What is claimed is:

1. A semiconductor device comprising:
   a first modulation circuit configured to receive a first sound source signal, sigma-delta modulate a signal based on the first sound source signal, and output a first sigma-delta modulated signal;
   a second modulation circuit configured to pulse-width modulate a signal based on the first sigma-delta modulated signal, and output a first pulse-width modulated signal;
   a first modulation inspection circuit configured to inspect the first modulation circuit, the first modulation inspection circuit including a first comparison circuit, the first comparison circuit being configured to:
   receive the first sigma-delta modulated signal and a reference signal having an expected value corresponding to the first sigma-delta modulated signal; and
   compare between the first sigma-delta modulated signal and the reference signal to generate a first comparison result; and
   a second modulation inspection circuit configured to inspect the second modulation circuit, wherein
   the first modulation inspection circuit and the second modulation inspection circuit are separated from each other.

2. The semiconductor device according to claim 1, wherein
   the first modulation circuit sigma-delta modulates a signal obtained by performing digital filter processing on the first sound source signal, and outputs the first sigma-delta modulated signal.

3. The semiconductor device according to claim 2, wherein
   in an inspection mode, the first modulation inspection circuit inputs, instead of the first sound source signal, at least one of an impulse signal and a step signal to the first modulation circuit, and inspects the first modulation circuit based on a signal output from the first modulation circuit.

4. The semiconductor device according to claim 1, wherein
   the second modulation inspection circuit compares a signal obtained by integrating signals based on the first pulse-width modulated signal in a predetermined cycle with the first sigma-delta modulated signal to inspect the second modulation circuit.

5. The semiconductor device according to claim 1, further comprising:
   an amplifier circuit configured to output an amplified signal obtained by amplifying the first pulse-width modulated signal to a sound reproduction device; and
   a coupling inspection circuit configured to inspect coupling between the amplifier circuit and the sound reproduction device.

6. The semiconductor device according to claim 5, wherein
   the coupling inspection circuit includes
   an inspection resistor coupled in series to an internal resistor of the sound reproduction device between a power supply and ground, and
   a voltage-controlled oscillator whose frequency changes according to a voltage of a coupling node between the inspection resistor and the internal resistor, and
   the coupling inspection circuit inspects the coupling between the amplifier circuit and the sound reproduction device based on an oscillation signal output from the voltage-controlled oscillator.

7. The semiconductor device according to claim 1, further comprising:
   a third modulation circuit configured to receive a second sound source signal, sigma-delta modulate a signal based on the second sound source signal, and output a second sigma-delta modulated signal;
a fourth modulation circuit configured to pulse-width modulate a signal based on the second sigma-delta modulated signal, and output a second pulse-width modulated signal; and
a third modulation inspection circuit configured to inspect the fourth modulation circuit, wherein
the first modulation inspection circuit, the second modulation inspection circuit, and the third modulation inspection circuit are separated from one another, and
the first modulation inspection circuit inspects the first modulation circuit and the third modulation circuit.

8. An electronic apparatus comprising:
the semiconductor device according to claim 1; and
a sound reproduction device, wherein
the semiconductor device includes an amplifier circuit configured to output an amplified signal obtained by amplifying the first pulse-width modulated signal to the sound reproduction device.

9. A semiconductor device comprising:
a first modulation circuit configured to receive a first sound source signal, sigma-delta modulate a signal based on the first sound source signal, and output a first sigma-delta modulated signal;
a second modulation circuit configured to pulse-width modulate a signal based on the first sigma-delta modulated signal, and output a first pulse-width modulated signal;
a first modulation inspection circuit configured to inspect the first modulation circuit;
a second modulation inspection circuit configured to inspect the second modulation circuit;
a third modulation circuit configured to receive a second sound source signal, sigma-delta modulate a signal based on the second sound source signal, and output a second sigma-delta modulated signal;
a fourth modulation circuit configured to pulse-width modulate a signal based on the second sigma-delta modulated signal, and output a second pulse-width modulated signal; and
a third modulation inspection circuit configured to inspect the fourth modulation circuit, wherein
the first modulation inspection circuit, the second modulation inspection circuit, and the third modulation inspection circuit are separated from one another, and
the first modulation inspection circuit inspects the first modulation circuit and the third modulation circuit.

* * * * *